(12) United States Patent
Usami et al.

(10) Patent No.: US 9,985,149 B2
(45) Date of Patent: May 29, 2018

(54) SEMICONDUCTOR DEVICE AND METHOD OF MANUFACTURING THE SAME

(71) Applicants: Renesas Electronics Corporation, Tokyo (JP); Photonics Electronics Technology Research Association, Tokyo (JP)

(72) Inventors: Tatsuya Usami, Hitachinaka (JP); Yoshiaki Yamamoto, Hitachinaka (JP); Keiji Sakamoto, Hitachinaka (JP); Tohru Mogami, Tokyo (JP); Tsuyoshi Horikawa, Tokyo (JP); Keizo Kinoshita, Tokyo (JP)

(73) Assignees: RENESAS ELECTRONICS CORPORATION, Tokyo (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days. days.

(21) Appl. No.: 15/244,853

(22) Filed: Aug. 23, 2016

(65) Prior Publication Data

US 2017/0069769 A1    Mar. 9, 2017

(30) Foreign Application Priority Data

Sep. 4, 2015   (JP) .................................. 2015-174295

(51) Int. Cl.
*H01L 31/0232*   (2014.01)
*H01L 31/18*   (2006.01)
(Continued)

(52) U.S. Cl.
CPC .... *H01L 31/02327* (2013.01); *G02B 6/12004* (2013.01); *G02B 6/136* (2013.01);
(Continued)

(58) Field of Classification Search
None
See application file for complete search history.

(56) References Cited

U.S. PATENT DOCUMENTS

2011/0027950 A1 *   2/2011   Jones ................ H01L 27/14643
438/155

FOREIGN PATENT DOCUMENTS

JP    2011-181874 A    9/2011

OTHER PUBLICATIONS

Novack et al. Germanium photodetector with 60 GHz bandwidth using inductive gain peaking. Nov. 11, 2013. OSA Publishing. vol. 21, Issue 23. pp. 28387-28393.*

* cited by examiner

*Primary Examiner* — Hoang-Quan Ho
(74) *Attorney, Agent, or Firm* — McGinn IP Law Group, PLLC.

(57) ABSTRACT

A performance of a semiconductor device is improved. In a method of manufacturing a semiconductor device, a first semiconductor portion and a second semiconductor portion made of silicon are formed on a base body via an insulation layer, and a third semiconductor portion including a semiconductor layer made of germanium is formed on the second semiconductor portion. Next, an insulation film is formed above the first semiconductor portion, an opening portion reaching the first semiconductor portion from an upper surface of the insulation film is formed, and a metal silicide layer is formed on a part of an upper surface of the first semiconductor portion exposed to the opening portion.

9 Claims, 21 Drawing Sheets

(51) Int. Cl.
 *G02B 6/12* (2006.01)
 *G02B 6/136* (2006.01)
 *G02B 6/122* (2006.01)
(52) U.S. Cl.
 CPC .......... *H01L 31/1808* (2013.01); *G02B 6/122* (2013.01); *G02B 2006/12061* (2013.01); *G02B 2006/12123* (2013.01)

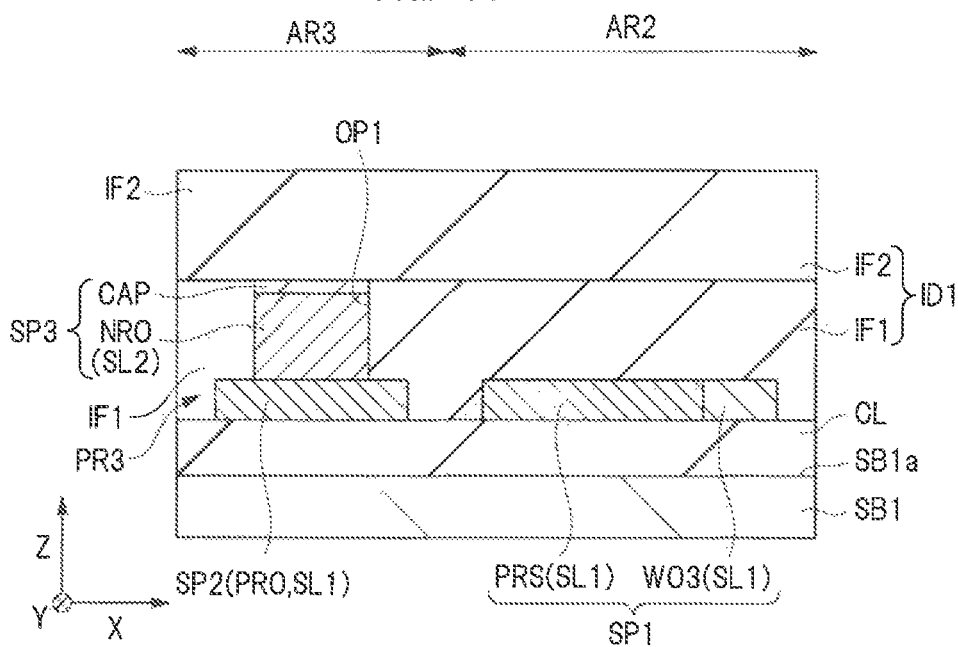
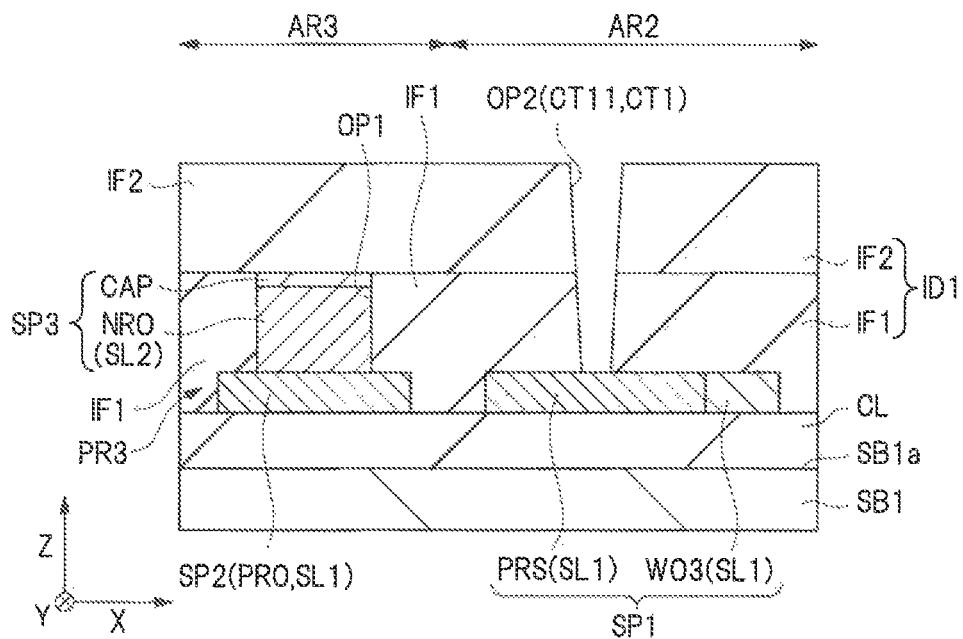

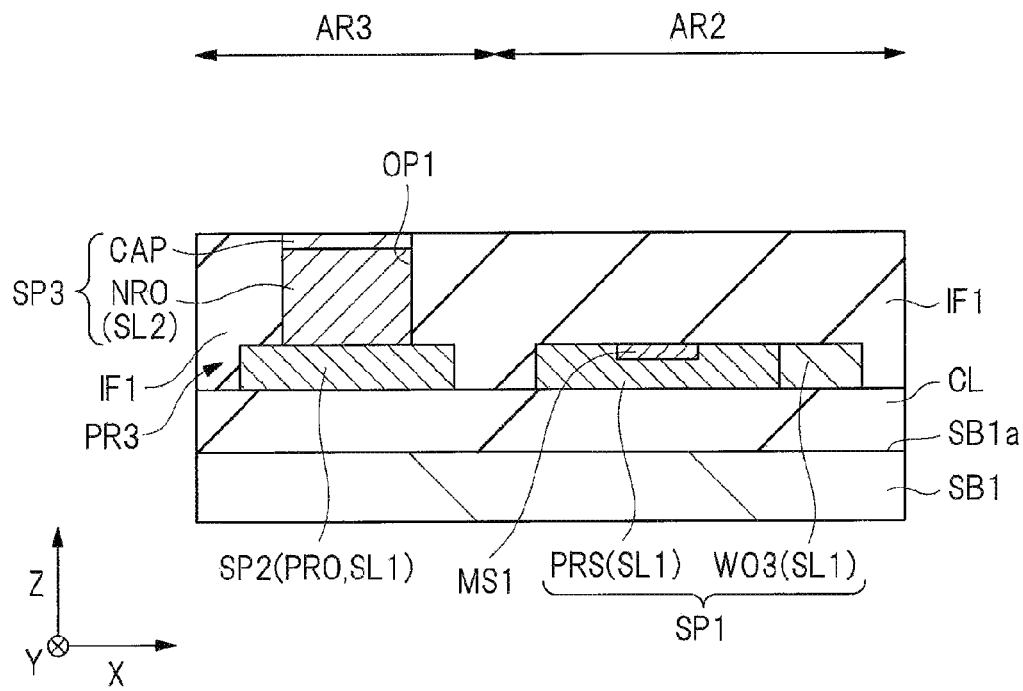
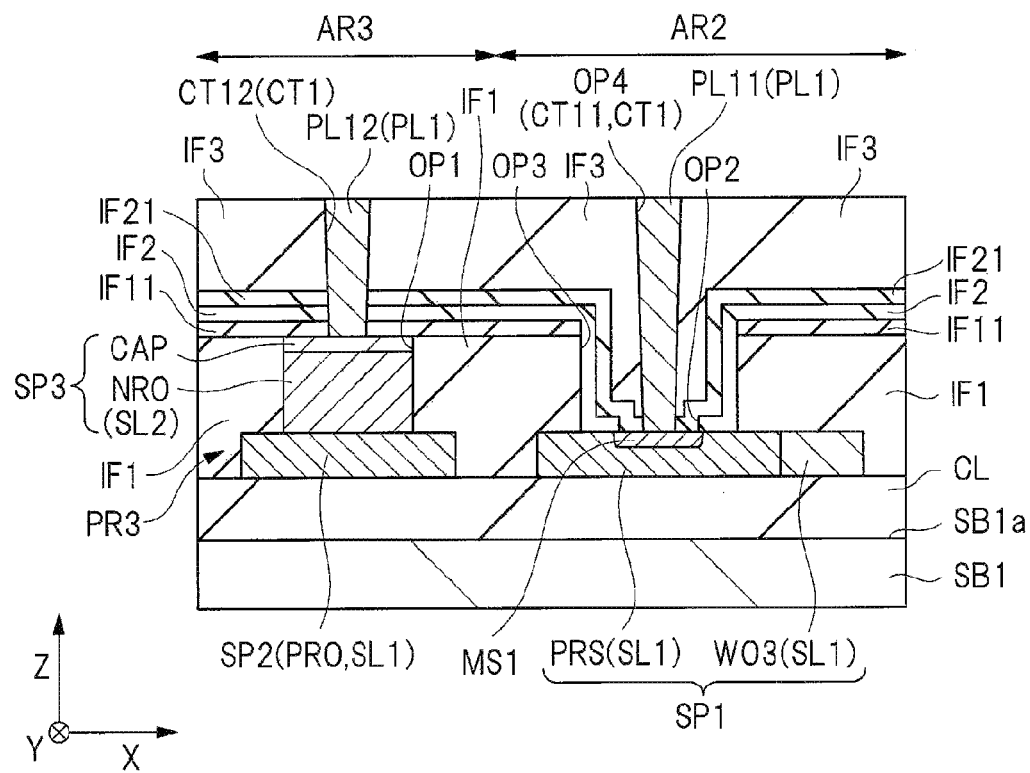

SEMICONDUCTOR DEVICE AND METHOD OF MANUFACTURING THE SAME

CROSS-REFERENCE TO RELATED APPLICATION

The present application claims priority from Japanese Patent Application No. 2015-174295 filed on Sep. 4, 2015, the content of which is hereby incorporated by reference into this application.

TECHNICAL FIELD OF THE INVENTION

The present invention relates to a semiconductor device and a method of manufacturing the same. For example, the present invention can be suitably utilized to a semiconductor device having an optical device in a semiconductor chip, and to a method of manufacturing the same.

BACKGROUND OF THE INVENTION

In recent years, a silicon photonics technique has been developed. The silicon photonics technique is a technique achieving a semiconductor device serving as an optical communication module by forming a transmission line for an optical signal using silicon as a material on a semiconductor substrate and integrating various optical devices and electronic devices formed from the transmission line for an optical signal. Such semiconductor devices includes the one having an optical waveguide made of a semiconductor layer formed on a base body via an insulation layer as the transmission line for an optical signal, and an insulation film formed on the insulation layer so as to cover the optical waveguide. At this time, the optical waveguide functions as a core layer, and the insulation layer and the insulation film function as cladding layers.

Further, such semiconductor devices include the one having a photoelectric conversion portion for converting an optical signal to an electric signal. In addition, such semiconductor devices include the one provided with a light receiver including a semiconductor layer made of germanium as the photoelectric conversion portion in order to detect near-infrared light having a wavelength up to about 1.6 μm that is a communication wavelength band.

Japanese Patent Application Laid-Open Publication No. 2011-181874 (Patent Document 1) discloses a technique for a germanium optical receiver provided with a first germanium layer formed on a silicon layer, a second germanium layer formed on the first germanium layer, and a silicon cap layer formed on the second germanium layer.

SUMMARY OF THE INVENTION

In such a semiconductor device, a metal silicide layer is formed on an upper surface of a semiconductor layer made of silicon in order to reduce a contact resistance between a semiconductor layer made of silicon and a plug.

However, a heat resistant temperature of the metal silicide layer is lower than a temperature suitable for forming a semiconductor layer made of germanium. Therefore, when the semiconductor layer made of germanium is formed after the metal silicide layer is formed, it is necessary to form the semiconductor layer made of germanium at a temperature lower than the heat resistant temperature of the metal silicide layer. However, when the semiconductor layer made of germanium is formed at such a low temperature, a defect density in the semiconductor layer made of germanium increases, and therefore, a photoelectric conversion efficiency decreases in a photoelectric conversion portion including the semiconductor layer made of germanium. As a result, the performance of the semiconductor device cannot be improved.

Other object and novel characteristics of the present invention will be apparent from the description of the present specification and the accompanying drawings.

According to an embodiment, in a method of manufacturing a semiconductor device, a first semiconductor portion and a second semiconductor portion made of silicon are formed on a base body via an insulation layer, and a third semiconductor portion including a semiconductor layer made of germanium is formed on the second semiconductor portion. Next, an insulation layer is formed above the first semiconductor portion, an opening portion reaching the first semiconductor portion is formed from an upper surface of the insulation film, and a metal silicide layer is formed on an upper surface of apart of the first semiconductor portion, the part being exposed to the opening portion.

Further, according to another embodiment, a semiconductor device has: a first semiconductor portion and a second semiconductor portion formed on a base body via an insulation layer and made of silicon, and a third semiconductor portion formed on the second semiconductor portion and including a semiconductor layer made of germanium. Further, the semiconductor device has an insulation film formed above the first semiconductor portion, a metal silicide layer formed on an upper surface of the first semiconductor portion, and an opening portion reaching the metal silicide layer from an upper surface of the insulation film. The metal silicide layer is arranged inside the opening portion or is arranged so as to project from the opening portion, and a projecting distance of the metal silicide layer arranged so as to project is equal to or less than a film thickness of the metal silicide layer.

According to an embodiment, a performance of the semiconductor device can be improved.

BRIEF DESCRIPTIONS OF THE DRAWINGS

FIG. 10 is a cross-sectional view of a principal part in a manufacturing step of the semiconductor device of the first embodiment;

FIG. 11 is a cross-sectional view of a principal part in a manufacturing step of the semiconductor device of the first embodiment;

FIG. 18 is a cross-sectional view of a principal part in a manufacturing step of the semiconductor device of the comparative example;

FIG. 19 is a cross-sectional view of a principal part of a semiconductor device of a second embodiment;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate or similar shapes and the like are included therein unless otherwise stated or except the case where it is conceivable that they are apparently excluded in principle. The same goes for the numerical value and the range described above.

Hereinafter, the typical embodiments will be described in detail based on the accompanying drawings. Note that components having the same function are denoted by the same reference symbols throughout all the drawings for describing the embodiments, and the description for the same or similar portions will be not repeated in principle unless otherwise particularly required.

Further, in some drawings used in the embodiments, hatching is omitted in some cases even in a cross-sectional view so as to make the drawings easy to see. Also, hatching is used in some cases even when seen in a plan view so as to make the drawings easy to see.

First Embodiment

Figure 1:
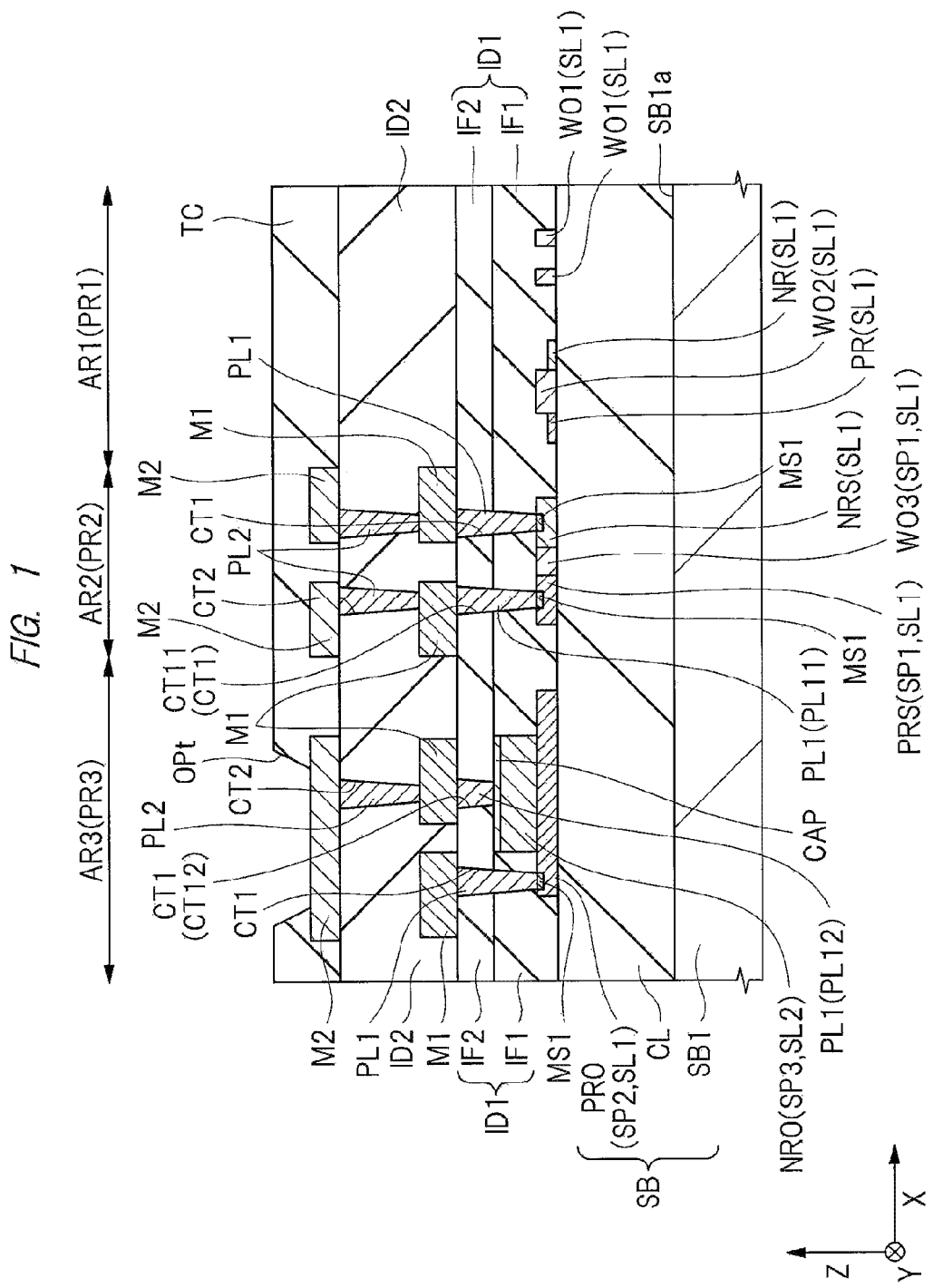
FIG. 1 is a cross-sectional view of a principal part of a semiconductor device of a first embodiment.

First of all, a semiconductor device of a first embodiment will be explained with reference to FIG. 1. FIG. 1 is a cross-sectional view of a principal part of the semiconductor device of the first embodiment.

As shown in FIG. 1, the present first embodiment exemplifies a semiconductor device having, for example, a transmission line portion for an optical signal PR1, an optical modulation portion PR2, and a photoelectric conversion portion PR3 formed on a base body SB1 made of single crystal silicon. Further, the present first embodiment exemplifies a semiconductor device having a multi-layered wirings with a two-layered structure. However, the present invention is not limited to this example.

<Transmission Line Portion for Optical Signal>

As shown in FIG. 1, the semiconductor device of the present first embodiment has the base body SB1, an insulation layer CL formed on the base body SB1, and a semiconductor layer SL1 formed on the insulation layer CL. A semiconductor substrate SB serving as an SOI (Silicon on Insulator) substrate is formed of the base body SB1, the insulation layer CL, and the semiconductor layer SL1. The base body SB1 is made of a p-type silicon (Si) single-crystal substrate, for example, whose plane orientation is (100) and whose resistance rate is about 5 to 50 Ωcm. The insulation layer CL is also referred to as BOX (buried Oxide) layer, and is made of, for example, a silicon oxide (SiO$_2$) film. The semiconductor layer SL1 is also referred to as SOI (Silicon on Insulator) layer, and is the one formed by thinning a p-type silicon single-crystal substrate, for example, whose plane orientation is (100) and whose resistance rate is about 5 to 50 Ωcm. The film thickness of the insulation layer CL can be set to, for example, about 2 to 3 μm, and the film thickness of the semiconductor layer SL1 can be set to, for example, about 180 to 250 nm.

The base body SB1 has regions AR1, AR2, and AR3 of a main surface SB1a of the base body SB1. In the region AR1, the transmission line portion for an optical signal PR1 is formed. Note that the optical modulation portion PR2 is formed in the region AR2, and that the photoelectric conversion portion PR3 is formed in the region AR3.

As shown in FIG. 1, in the region AR1, various transmission lines for an optical signal, that is, optical waveguides WO1 and WO2 serving as optical signal lines are formed. Each of the optical waveguides WO1 and WO2 functions as a core layer.

As shown in FIG. 1, two directions intersecting, preferably orthogonal to, each other within the main surface SB1a of the base body SB1 are defined as an X-axis direction and a Y-axis direction, and a direction perpendicular to the main surface SB1a of the base body SB1, that is, a vertical direction is defined as a Z-axis direction. Further, in the specification of the present application, the expression "when seen in a plan view" means a case viewed from a direction perpendicular to the main surface SB1a of the base body SB1.

The optical waveguide WO1 is made of the semiconductor layer SL1. Two optical waveguides WO1 are formed in the region AR1. Two optical waveguides WO1 are formed on the insulation layer CL in the region AR1. Two optical waveguides WO1 extend in, for example, the Y-axis direction (a direction perpendicular to a sheet in FIG. 1), and they are arranged so as to be spaced from each other in, for example, the X-axis direction when seen in a plan view. Therefore, optical signal introduced into the optical waveguide WO1 progresses in the Y-axis direction. Note that an optical phase shifter for shifting a phase of light may be formed as one example of the optical waveguide WO1 although illustration is omitted. The optical phase shifter is also made of the semiconductor layer SL1 as similar to the other optical wave guide WO1.

The optical waveguide WO2 is also made of the semiconductor layer SL1 as similar to the optical waveguide WO1. The semiconductor layer SL1 included in the optical waveguide WO2 is processed in a rib shape. The optical waveguide WO2 is formed of a thick portion of the semiconductor layer SL1 processed in a rib shape, that is, a rib portion thereof. The optical waveguide WO2 extends in the Y-axis direction (a direction perpendicular to a sheet in FIG. 1). Therefore, an optical signal introduced into the optical waveguide WO2 progresses in the Y-axis direction.

The heights of the optical waveguides WO1 and WO2 are equal to, for example, the film thickness of the above-described semiconductor layer SL1, and the widths of the optical waveguides WO1 and WO2 in the X-axis direction are, for example, about 500 nm. Further, a thickness of a thin portion of the semiconductor layer SL1 is, for example, about 30 to 170 nm. Impurities are introduced into the optical wavelengths WO1 and WO2, each impurity concentration is in a range of, for example, $10^{15}$ to $10^{19}$ cm$^{-3}$, and a typical value of the concentration is, for example, about $10^{15}$ cm$^{-3}$.

A p-type impurity is introduced into the semiconductor layer SL1 on one side (the left side in FIG. 1) in the X-axis direction of the optical waveguide WO2, so that a p-type semiconductor PR is formed. The p-type semiconductor PR is formed so as to be parallel to the optical waveguide WO2. Further, an n-type impurity is introduced into the semiconductor layer SL1 on the other side (the right side in FIG. 1) of the optical waveguide WO2 in the X-axis direction, so that an n-type semiconductor NR is formed. The n-type semiconductor NR is in parallel to the optical waveguide WO2. That is, a portion of the semiconductor layer SL1 positioned between the p-type semiconductor PR and the n-type semiconductor NR is the optical waveguide WO2.

When a forward bias is applied to the above-described structure, carriers are injected into the optical waveguide WO2. When the carriers are injected into the optical waveguide WO2, a carrier plasma effect, that is, a phenomenon caused by a fact that the optically-generated carriers increase electron-hole pairs (plasmas) occurs in the optical waveguide WO2, which results in change of an optical refraction index in the optical waveguide WO2. The change of the optical refraction index in the optical waveguide WO2 changes the wavelength of light progressing in the optical waveguide WO2, and therefore, a phase of the light can be changed in a course of the progression in the optical waveguide WO2.

The optical waveguides WO1 and WO2 are covered with interlayer insulation films ID1 and ID2 and a protection film TC. Each of the interlayer insulation films ID1 and ID2 is made of, for example, silicon oxide. The protection film TC is made of, for example, silicon oxynitride (SiON). A wiring M1 and a wiring M2 described later are not formed in the transmission line portion for an optical signal PR1.

Each of the optical waveguides WO1 and WO2 is made of silicon, and each of the insulation layer CL and the interlayer insulation film ID1 is made of silicon oxide. Further, the optical waveguides WO1 and WO2 are surrounded by the insulation layer CL and the interlayer insulation film ID1. For example, the refraction index of silicon to light having a wavelength of, for example, 1.55 μm is, for example, 3.5, the refraction index of silicon oxide thereto is, for example, 1.46, and the refraction index of silicon is higher than the refraction index of silicon oxide. Therefore, the optical waveguides WO1 and WO2 function as core layers, and the insulation layer CL and the interlayer insulation film ID1 function as cladding layers.

<Optical Modulation Portion>

As shown in FIG. 1, the optical modulation portion PR2 is formed in the region AR2. The optical modulation portion PR2 changes an electric signal to an optical signal. The optical modulation portion PR2 is made of the semiconductor layer SL1. Here, the optical modulation portion having a pin structure will be explained as one example. However, the present invention is not limited to this.

The optical modulation portion PR2 has an optical waveguide WO3, a p-type semiconductor PRS, and an n-type semiconductor NRS, and it has a pin structure. The optical waveguide WO3, the p-type semiconductor PRS, and the n-type semiconductor NRS are made of the semiconductor layer SL1 as similar to the optical waveguides WO1 and WO2.

The optical waveguide WO3 extends in the Y-axis direction (a direction perpendicular to a sheet in FIG. 1). Therefore, an optical signal introduced into the optical waveguide WO3 progresses in the Y-axis direction. Impurities are not introduced into the optical waveguide WO3, so that the optical waveguide WO3 is formed of an intrinsic semiconductor, that is, i (intrinsic)-type semiconductor.

A p-type impurity is introduced into the semiconductor layer SL1 on one side (the left side in FIG. 1) in the X-axis direction of the optical waveguide WO3, so that a p-type semiconductor PRS is formed. The p-type semiconductor PRS is parallel to the optical waveguide WO3. Further, an n-type impurity is introduced into the semiconductor layer SL1 on the other side (the right side in FIG. 1) of the optical waveguide WO3 in the X-axis direction, so that an n-type semiconductor NRS is formed. The n-type semiconductor NRS is in parallel to the optical waveguide WO3. That is, a portion of the semiconductor layer SL1 positioned between the p-type semiconductor PRS and the n-type semiconductor NRS is the optical waveguide WO3 made of the intrinsic semiconductor, so that the pin structure is formed. To the p-type semiconductor PRS and the n-type semiconductor NRS, the plug PL1 is connected as electrodes, respectively.

A carrier density in the optical waveguide WO3 made of intrinsic semiconductor is changed by a voltage applied to an electrode, and a refraction index in this region is changed. In this manner, an effective refraction index to the light propagating in the optical modulation portion PR2 is changed, so that a phase of light outputted from the optical modulation portion PR2 can be changed.

The optical modulation portion PR2 is covered with the interlayer insulation film ID1, and a connection hole CT1 functioning as a contact hole reaching each of the p-type semiconductor PRS and the n-type semiconductor NRS through the interlayer insulation film ID1 is formed in the interlayer ID1. Note that the connection hole CT1 reaching the p-type semiconductor PRS is referred to as connection hole CT11.

A plug PL1 made of tungsten (W) is buried inside the connection hole CT1, the p-type semiconductor PRS and the first layer wiring M1 are electrically connected via the plug PL1, and the n-type semiconductor NRS and the wiring M1 are electrically connected via the plug PL1. The wiring M1 is made of, for example, aluminum-copper alloy (Al—Cu alloy). Note that the plug PL1 formed inside the connection hole CT11 is referred to as plug PL11.

The metal silicide layer MS1 is formed on an upper surface of a portion of the p-type semiconductor PRS exposed to a bottom of the connection hole CT1, and the p-type semiconductor PRS and the wiring M1 are electrically connected via the metal silicide layer MS1 and the plug PL1. Further, a metal silicide layer MS1 is formed on an upper surface of a portion of the n-type semiconductor NRS exposed to a bottom of the connection hole CT1, and the n-type semiconductor NRS and the wiring M1 are electrically connected via the metal silicide layer MS1 and the plug PL1.

The wiring M1 is covered with the interlayer insulation film ID2, and a connection hole CT2 functioning as a via hole reaching the wiring M1 through the interlayer insulation film ID2 is formed in the interlayer insulation film ID2. A plug PL2 made of tungsten (W) is buried in the connection hole CT2, and the wiring M1 and a second layer wiring M2 are electrically connected via the plug PL2. The wiring M2 is covered with the protection film TC. The wiring M2 is made of, for example, aluminum-copper alloy.

The optical waveguide WO3 is made of silicon, and each of the insulation layer CL and the interlayer insulation film ID1 is made of silicon oxide. Further, the optical waveguide WO3 is surrounded by the insulation layer CL and the interlayer insulation film ID1. Therefore, the optical waveguide WO3 also function as a core layer as similar to the optical waveguides WO1 and WO2, and the insulation layer CL and the interlayer insulation film ID1 function as cladding layers.

<Optical Modulation Portion>

As shown in FIG. 1, the optical modulation portion PR3 is formed in the region AR3. The optical modulation portion PR3 changes an electric signal to an optical signal. Here, the optical modulation portion having a p/n-junction structure in which the p-type semiconductor and the n-type semiconductor are joined to each other will be explained as one example. However, the present invention is not limited to this.

The photoelectric conversion portion PR3 has such a p/n junction structure as having a p-type semiconductor PRO and an n-type semiconductor NRO, or has such a pin junction structure as having a p-type semiconductor PRO and an i/n-type semiconductor NRO in which a non-doped, that is, an i-type region is formed in a lower layer of a semiconductor NRO positioned on the p-type semiconductor PRO and which has an n-type region only in an upper portion of the semiconductor NRO. The photoelectric conversion portion PR3 is formed of the p-type semiconductor PRO and the n-type or i/n-type semiconductor NRO. The p-type semiconductor PRO is made of a semiconductor layer SL1 to which p-type impurities are introduced. The n-type or i/n-type semiconductor NRO is formed on the p-type semiconductor PRO. The n-type or i/n-type semiconductor NRO is made of a semiconductor layer SL2 to which n-type impurities are partially or entirely introduced, and the semiconductor layer SL2 is made of germanium (Ge). Germanium is narrower in a forbidden band width than silicon. Therefore, for example, near-infrared light having a wavelength up to about 1.6 μm that is a communication wavelength band can be detected by the p/n junction or the pin junction formed of the n-type or i/n-type germanium and p-type silicon.

Further, a cap layer CAP is formed on the n-type or i/n-type semiconductor NRO. The cap layer CAP is made of silicon or silicon germanium (SiGe), and prevents damage such as surface roughness of germanium contained in the n-type semiconductor NRO or reduction in a layer thickness.

The plug PL1 is connected to each of the cap layer CAP on the n-type semiconductor NRO and the p-type semiconductor PRO as an electrode. A direct current flowing in the p/n junction portion included in the photoelectric conversion portion PR3 because of a photovoltaic effect is extracted to the outside by the plug PL1.

The photoelectric conversion portion PR3 is covered with the interlayer insulation film ID1, and a connection hole CT1 serving as a contact hole reaching the cap layer CAP and the p-type semiconductor PRO through the interlayer insulation film iD1 is formed in the interlayer insulation film ID1. The plug PL1 made of tungsten is buried in the connection hole CT1, the n-type semiconductor NPO and the wiring M1 are electrically connected via the cap layer CAP and the plug PL1, and the p-type semiconductor PRO and the wiring M1 are electrically connected via the plug PL1. Note that the connection hole CT1 reaching the cap layer CAP is referred to as connection hole CT12. Further, the plug PL1 formed in the connection hole CT12 is referred to as plug PL12.

A metal silicide layer MS1 is formed on an upper surface of a portion of the p-type semiconductor PRO exposed to a bottom of the connection hole CT1, and the p-type semiconductor PRO and the wiring M1 are electrically connected via the metal silicide layer MS1 and the plug PL1.

The wiring M1 is covered with the interlayer insulation film ID2, and a connection hole CT2 serving as a via hole reaching the wiring M1 through the interlayer insulation film ID2 is formed in the interlayer insulation film ID2. A plug PL2 made of tungsten is buried in the connection hole CT2, and the wiring M1 and the wiring M2 are electrically connected via the plug PL2.

The wiring M2 is covered with the protection film TC, and an opening portion OPt reaching the wiring M2 through the protection film TC is formed in the protection film TC. The wiring M2 is exposed to a bottom of the opening OPt.

<Structures of Optical Modulation Portion and Photoelectric Conversion Portion>

Figure 2:
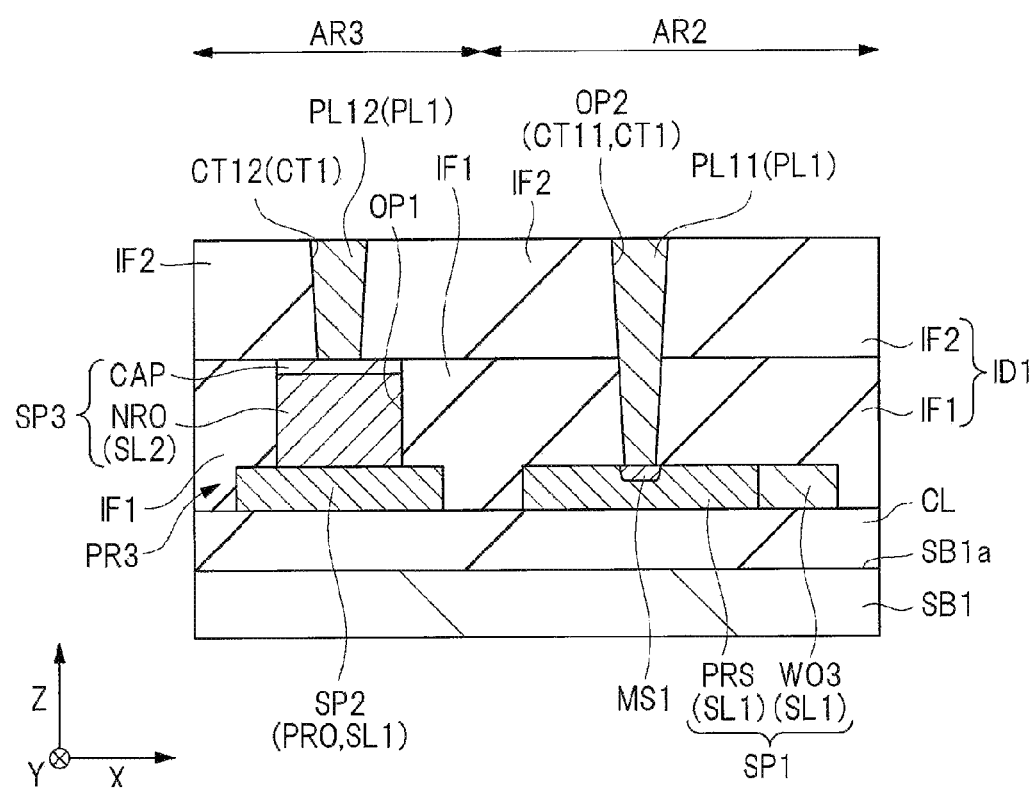
FIG. 2 is a cross-sectional view of a principal part of the semiconductor device of the first embodiment.
Figure 3:
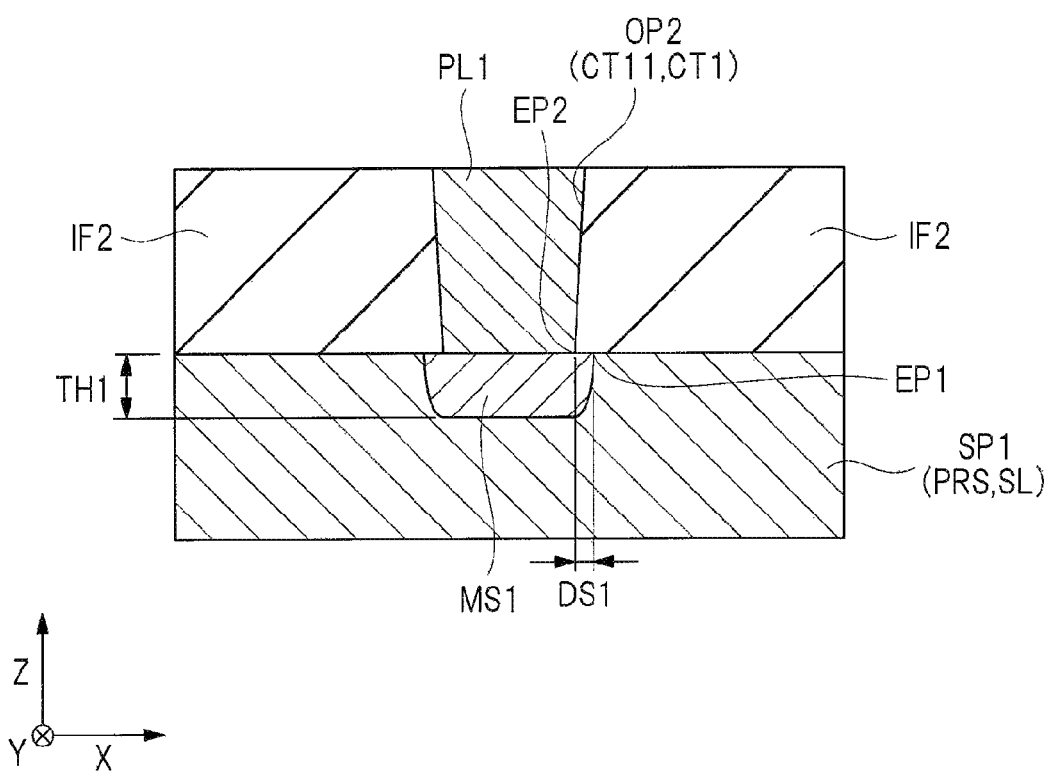
FIG. 3 is a cross-sectional view of a principal part of the semiconductor device of the first embodiment.

Next, with reference to FIGS. 2 and 3, the structures of the optical modulation portion PR2 and the photoelectric conversion portion PR3 will be explained in detail. Each of FIGS. 2 and 3 is a cross-sectional view of a principal part of the semiconductor device of the first embodiment. FIG. 2 shows the enlarged regions AR2 and AR3. FIG. 3 shows an enlarged peripheral portion of the metal silicide layer MS1.

As shown in FIG. 2, the semiconductor device of the present first embodiment has a semiconductor portion SP1 formed on the insulation layer CL1 and made of the semiconductor layer SL1, and a semiconductor portion SP2 formed on the insulation layer CL and made of the semiconductor layer SL1.

The semiconductor portion SP1 is made of the semiconductor layer SL1 formed on the insulation layer CL in the region AR2, and the semiconductor portion SP2 is made of the semiconductor layer SL1 formed on the insulation layer CL in the region AR3. As described above, the semiconductor layer SL1 is made of silicon. Therefore, the semiconductor portions SP1 and SP2 are made of silicon. The semiconductor portion SP1 includes the optical waveguide WO3 and the p-type semiconductor PRS, and the semiconductor portion SP2 includes the p-type semiconductor PRO. That is, the optical waveguide WO3 is formed of the semiconductor portion SP1. Further, the semiconductor portion SP2 is made of p-type silicon. Note that the semiconductor portion SP1 may include the n-type semiconductor NRS although illustration is omitted (see FIG. 1).

The semiconductor device of the present first embodiment has the insulation film IF1 formed on the semiconductor portion SP1 and on the semiconductor portion SP2. The insulation film IF1 is preferably made of silicon oxide. As explained with reference to FIG. 7 described later, the insulation film IF1 made of silicon oxide is formed by, for example, a Plasma Enhanced Chemical Vapor Deposition (PECVD) method.

Further, in the region AR3, the semiconductor device of the present first embodiment has an opening portion OP1 reaching the semiconductor portion SP2 through the insulation film IF1 and the semiconductor portion SP3 formed on a portion of the semiconductor portion SP2 exposed to the opening portion OP1 within the opening portion OP1. The semiconductor portion SP3 includes an n-type semiconductor NRO formed on the p-type semiconductor PRO and being the n-type semiconductor layer SL2, and the cap layer CAP formed on the n-type semiconductor NRO. The n-type semiconductor layer SL2 is made of n-type or i/n-type germanium. Therefore, the photoelectric conversion portion PR3 for converting an optical signal to an electric signal is formed of the semiconductor portion SP2 and the semiconductor layer SL2. Note that the cap layer CAP is as described above with reference to FIG. 1.

On the other hand, the semiconductor device of the present first embodiment has the insulation film IF2 formed above the semiconductor portion SP1. Specifically, the insulation film IF2 is formed on the semiconductor portion SP3 and on the insulation film IF1. The insulation film IF2 is preferably made of silicon oxide as similar to the insulation film IF1. As described later with reference to FIG. 10, the insulation film IF2 made of silicon oxide is formed by, for example, the PECVD method.

Further, the semiconductor device of the present first embodiment has the metal silicide layer MS1 formed on an upper surface of the semiconductor portion SP1. The metal silicide layer MS1 is made of, for example, a cobalt silicide layer, a nickel silicide layer, or a platinum-added nickel silicide layer. As described later with reference to FIG. 12, the metal silicide layer MS1 can be formed on the upper surface of the semiconductor portion SP1 by performing the so-called salicide process.

Further, the semiconductor device of the present first embodiment has an opening portion OP2 reaching an upper surface of the metal silicide layer MS1 from an upper surface of the insulation film IF2. Specifically, the opening portion OP2 reaches the metal silicide layer MS1 through the insulation films IF2 and IF1.

In the semiconductor device of the present first embodiment, the opening portion OP2 is a connection hole CT11. A conductive film is buried in the connection hole CT11, and a plug PL11 serving as a connection electrode made of the buried conductive film is formed. That is, the plug PL11 is formed on the metal silicide layer MS1 and contacts with the metal silicide layer MS1.

As shown in FIG. 3, an end portion of the metal silicide layer MS1 on a first side (for example, on a positive side in the X-axis direction) in a first direction (for example, the X-axis direction) when seen in a plan view is defined as an end portion EP1, and an end portion of the opening portion OP2 on the first side (for example, on the positive side in the X-axis direction) in the first direction (for example, the X-axis direction) when seen in a plan view is defined as an end portion EP2. At this time, when seen in a plan view, the end portion EP1 is arranged within the opening portion OP2, or is arranged so as to be out of the end portion EP2, that is, so as to project to the first side (for example, on the positive side in the X-axis direction). A projecting distance DS1 in the first direction (for example, the X-axis direction) from the end portion EP2 to the end portion EP1 arranged so as to project to the first side (for example, on the positive side in the X-axis direction) is equal to or less than the film thickness TH1 of the metal silicide layer MS1. In other words, the distance DS1 in the first direction (for example, the X-axis direction) from the end portion EP2 to the end portion EP1 arranged on the first side (for example, on the positive side in the X-axis direction) of the end portion EP2 is equal to or less than the film thickness TH1 of the metal silicide layer MS1.

As described later with reference to FIGS. 9 to 12, in a method of manufacturing a semiconductor device of the present first embodiment, the semiconductor portion SP3 including the n-type or i/n-type semiconductor NRO made of germanium is formed, and then, the opening portion OP2 is formed, and the metal silicide layer MS1 is formed on the portion of the upper surface of the semiconductor portion SP1 exposed to the bottom of the opening portion OP2. Therefore, the metal silicide layer MS1 is formed so as to align with the inner wall of the opening portion OP2. Meanwhile, it is thought that a distance of the formation of the metal silicide layer MS1 by the reaction of the upper surface of the semiconductor portion SP1 with the metal film made of, for example, cobalt or nickel is substantially isotropic. Therefore, even when the metal silicide layer MS1 projects from an outer periphery of the bottom of the opening portion OP2 to progress, the projecting distance is equal to or less than the film thickness which is a distance where the metal silicide layer MS1 progresses in a depth direction.

Thus, the insulation film IF2 and the opening portion OP2 formed on the upper surface of the insulation film IF2 are used as a mask pattern for forming the metal silicide layer MS1. That is, in the present first embodiment, the connection hole CT11 is equal to the opening portion OP2 used as the mask for forming the metal silicide layer MS1, the metal silicide layer MS1 is formed so as to align with the inner wall of the connection hole CT11, and is formed in a region substantially identical to the region of the lower surface of the plug PL1.

Note that the expression "the arrangement of the end portion EP1 within the opening portion OP2 when seen in a plan view" means that the end portion EP1 is arranged closer to a central portion side of the bottom portion of the opening portion OP2 than the outer periphery of the bottom portion of the opening portion OP2, or is arranged on the outer periphery of the bottom portion of the opening portion OP2 when seen in a plan view. Further, the "the film thickness TH1 of the metal silicide layer MS1" means the maximum value of the film thicknesses in each portion of the metal silicide layer MS1, that is, the film thickness of the central portion of the metal silicide layer MS1 when seen in a plan view.

<Method of Manufacturing Semiconductor Device>

Figure 4:
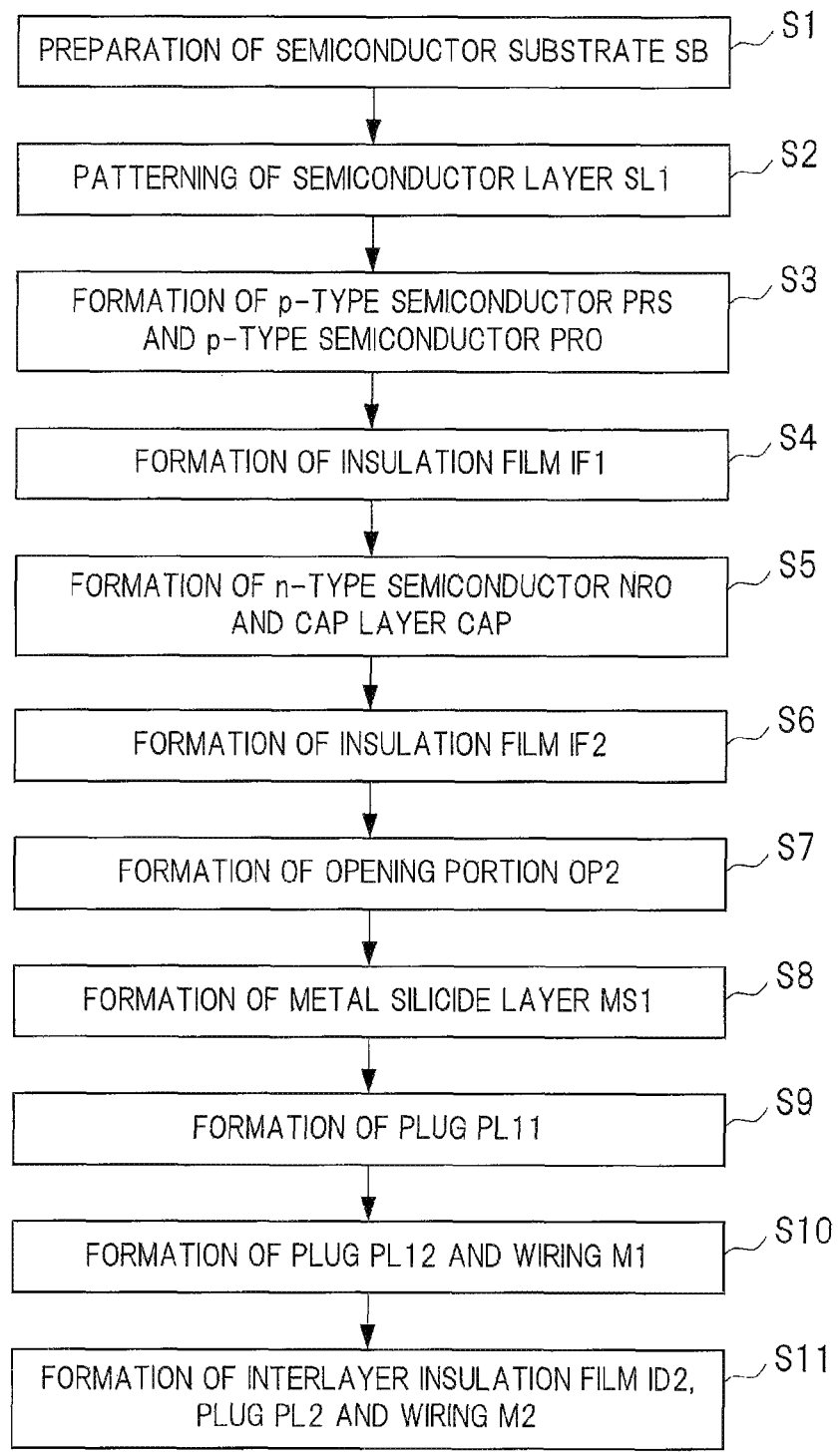
FIG. 4 is a process flowchart showing a part of a manufacturing step of the semiconductor device of the first embodiment.

Next, a method of manufacturing a semiconductor device of the present first embodiment will be explained. FIG. 4 is a process flowchart showing a part of the method of manufacturing a semiconductor device of the first embodiment. Note that FIG. 4 mainly shows a step in the region AR2 to be the region where the optical modulation portion PR2 is formed and the region AR3 to be the region where the photoelectric conversion portion PR3.

Each of FIGS. 5 to 15 is a cross-sectional view of a principal part in a manufacturing step of the semiconductor device of the present first embodiment. Among them, FIGS. 6 to 13 show the enlarged regions AR2 and AR3. Further, in the region AR2 in FIGS. 6 to 13, a part of the p-type semiconductor PRS and the optical waveguide WO3 of the optical modulation portion PR2 is shown, but illustration of the connection hole CT1 of the photoelectric conversion portion PR3 is omitted for easy understanding.

Figure 5:
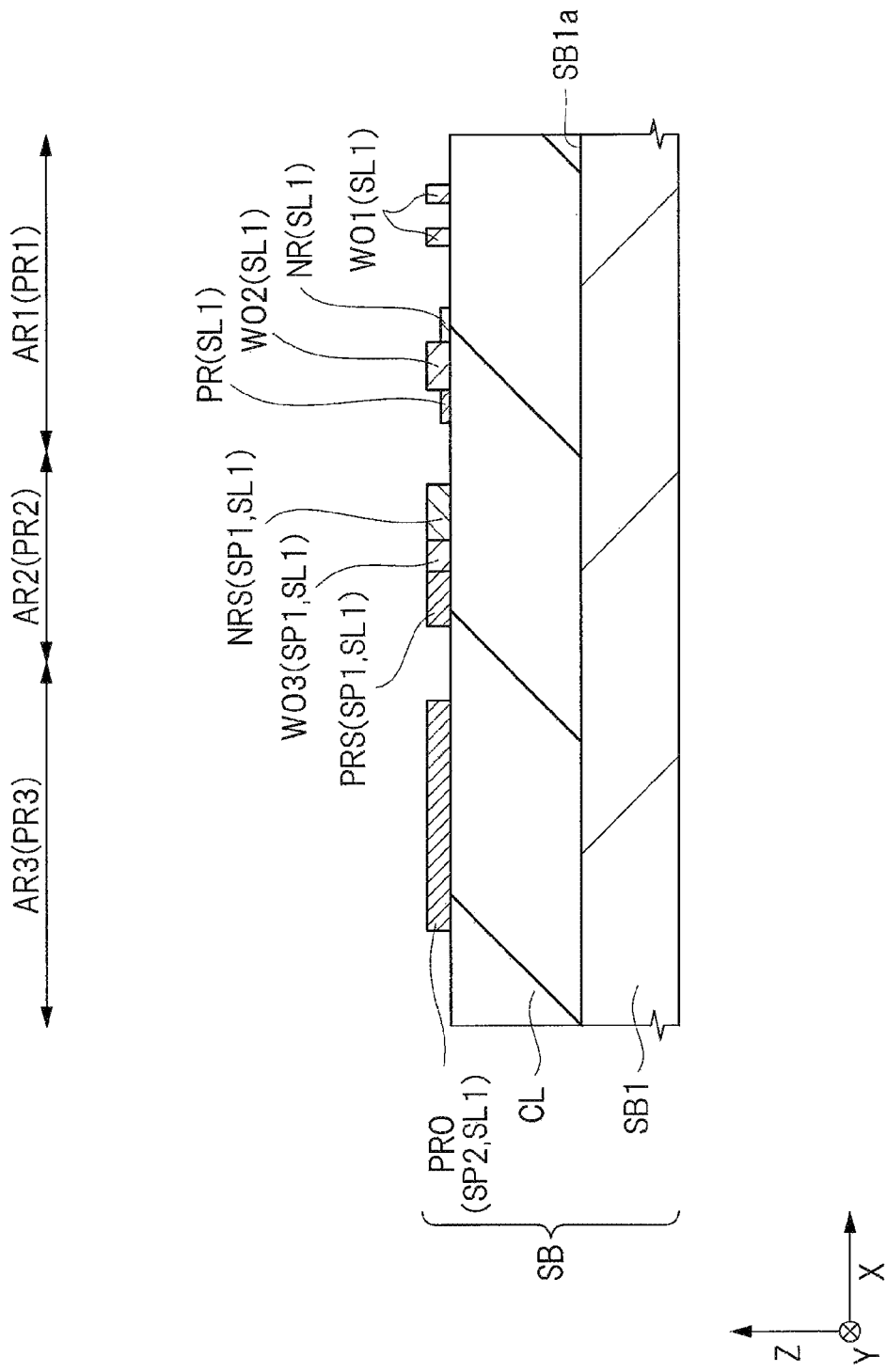
FIG. 5 is a cross-sectional view of a principal part in a manufacturing step of the semiconductor device of the first embodiment.
Figure 14:
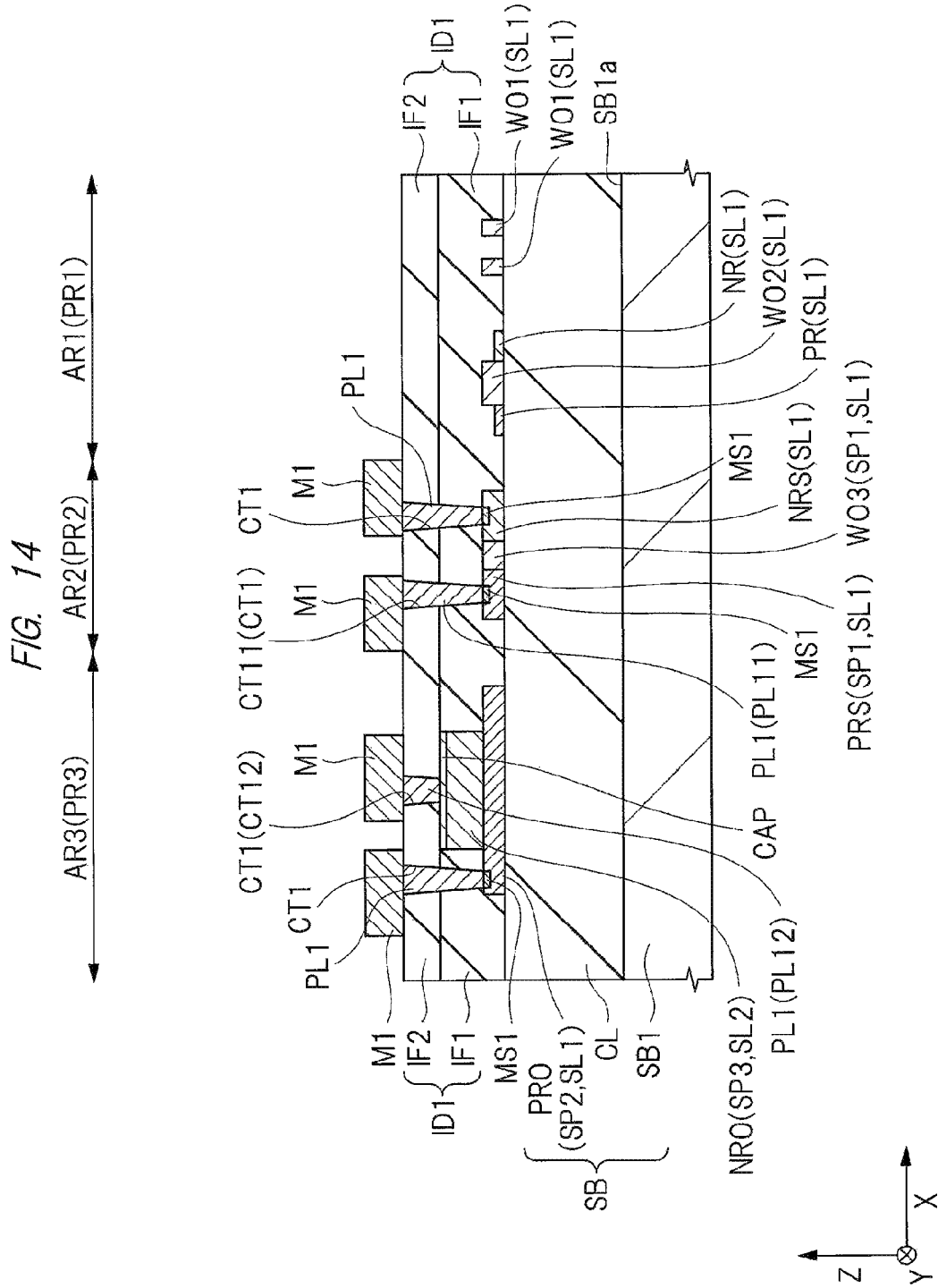
FIG. 14 is a cross-sectional view of a principal part in a manufacturing step of the semiconductor device of the first embodiment.
Figure 15:
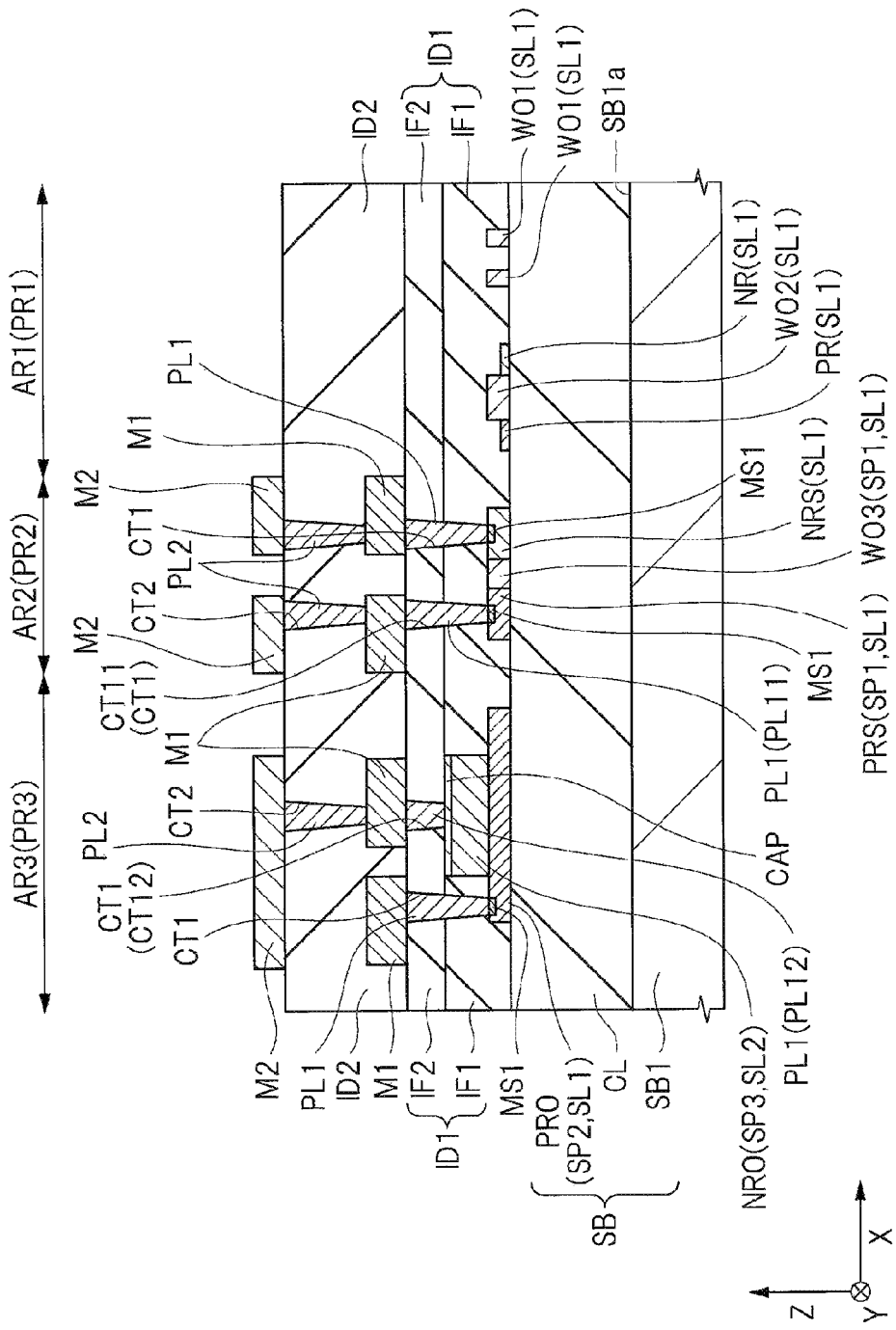
FIG. 15 is a cross-sectional view of a principal part in a manufacturing step of the semiconductor device of the first embodiment.

Meanwhile, each of the cross-sectional views of FIGS. 5, 14 and 15 shows an aspect in which the transmission line portion for an optical signal PR1 is formed in the region AR1 of the base body SB1 on the main surface SB1a side, in which the optical conversion portion PR2 is formed in the region AR2 of the base body SB1 on the main surface SB1a side, and in which the photoelectric conversion portion PR3 is formed in the region AR3 of the base body SB1 on the main surface SB1a side.

Figure 6:
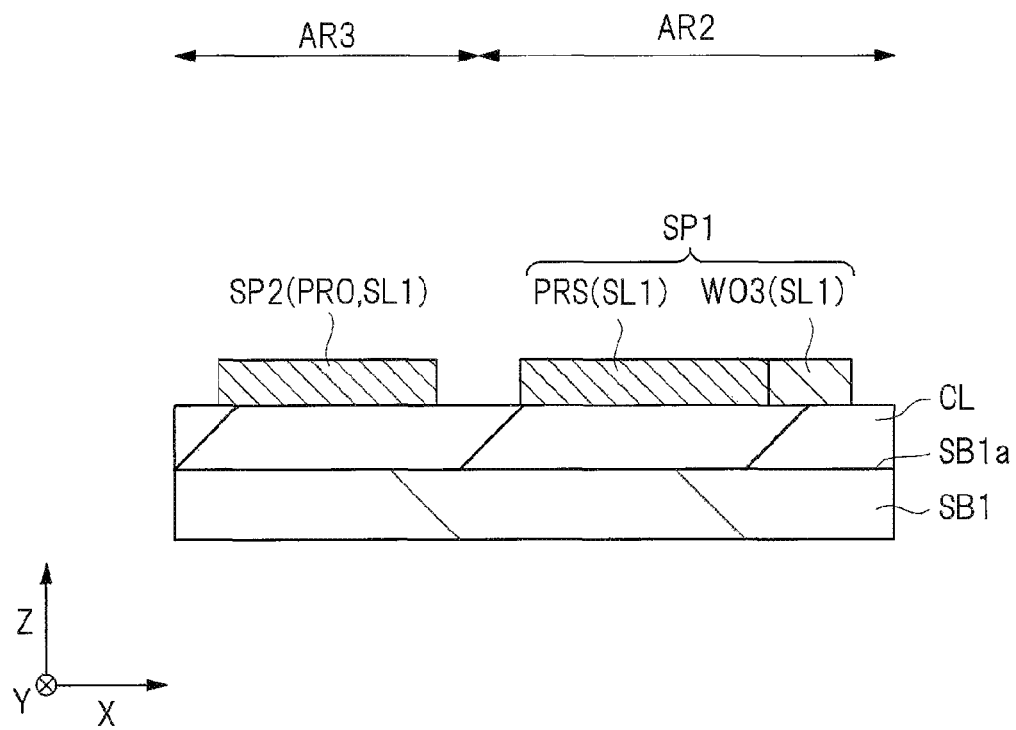
FIG. 6 is a cross-sectional view of a principal part in a manufacturing step of the semiconductor device of the first embodiment.

First, as shown in FIGS. 5 and 6, a semiconductor substrate SB is prepared (Step S1 in FIG. 4). The semiconductor substrate SB has a base body SB1, an insulation layer CL formed on the base body SB1, and a semiconductor layer SL1 formed on the insulation layer CL. The base body SB1 is made of p-type silicon single-crystal substrate whose plane orientation is (100) and whose resistance rate is about 5 to 50 Ωcm. The insulation layer CL contains oxygen and silicon, and is preferably made of, for example, a silicon oxide film. The semiconductor layer SL1 is the one formed by thinning a p-type silicon single-crystal substrate, for example, whose plane orientation is (100) and whose resistance rate is about 5 to 50 Ωcm. The film thickness of the insulation layer CL, and the film thickness of the semiconductor layer SL1 are as previously described with reference to FIG. 1.

The base body SB1 has the regions AR1, AR2, and AR3 of the main surface SB1a of the substrate SB1. The transmission line portion for an optical signal PR1 is formed in the region AR1, the optical conversion portion PR2 is formed in the region AR2, and the photoelectric conversion portion PR3 is formed in the region AR3.

Next, the semiconductor layer SL1 is patterned (Step S2 in FIG. 4).

In this Step S2, first, as shown in FIGS. 5 and 6, the semiconductor layer SL1 is patterned by using a photolithography technique and an etching technique. In this manner, optical waveguides WO1 and WO2 made of the semiconductor layer SL1 are formed on the insulation layer CL in the region AR1, a semiconductor portion SP1 made of the semiconductor layer SL1 is formed in the region AR2, and a semiconductor portion SP2 made of the semiconductor layer SL1 is formed in the region AR3. For example, two optical waveguides WO1 extend in the Y-axis direction and are arranged so as to be spaced from each other in the X-axis direction when seen in a plan view.

Next, as shown in FIGS. 5 and 6, a p-type semiconductor PRS and a p-type semiconductor PRO are formed (Step S3 in FIG. 4).

In this step S3, p-type impurities are introduced into the semiconductor layer SL1 in the regions AR1, AR2 and AR3 by an ion implantation method using a resist pattern (not shown) as a mask. At this time, in the region AR1, p-type impurities are introduced into the semiconductor layer SL1 of the optical waveguide WO2 on one side (the left side in FIG. 5) in the X-axis direction so that a p-type semiconductor PR is formed. Further, in the region AR2, p-type impurities are introduced into a portion of the semiconductor layer SL1 of the semiconductor portion SP1 positioned on one side (the left side in FIG. 5) in the X-axis direction so that a p-type semiconductor PRS is formed. Further, in the region AR3, p-type impurities are introduced into the semiconductor portion SP2 so that a p-type semiconductor PRO is formed. The semiconductor portion SP2 is made of the p-type semiconductor PRO. That is, the semiconductor portion SP2 is made of p-type silicon.

Further, in the step S3, n-type impurities are introduced into the semiconductor layer SL1 in the regions AR1 and AR2 by an ion implantation method using a resist pattern (not shown) as a mask. At this time, in the region AR1, p-type impurities are introduced into the semiconductor layer SL1 of the optical waveguide WO2 on the other side (the right side in FIG. 5) in the X-axis direction so that an n-type semiconductor NR is formed. Further, in the region AR2, n-type impurities are introduced into the semiconductor layer SL1 of the semiconductor portion SP1 positioned on the other side (the right side in FIG. 5) in the X-axis direction so that an n-type semiconductor NRS is formed. At this time, the optical waveguide WO3 is formed of the semiconductor layer SL1 of a portion of the semiconductor portion SP1 positioned between the p-type semiconductor PRS and the n-type semiconductor NRS. That is, the semiconductor portion SP1 is made of the p-type semiconductor PRS and the optical waveguide WO3.

Note that the p-type impurities and the n-type impurities may be introduced first, and then, the introduced impurities may be activated by performing a heat treatment.

Figure 7:
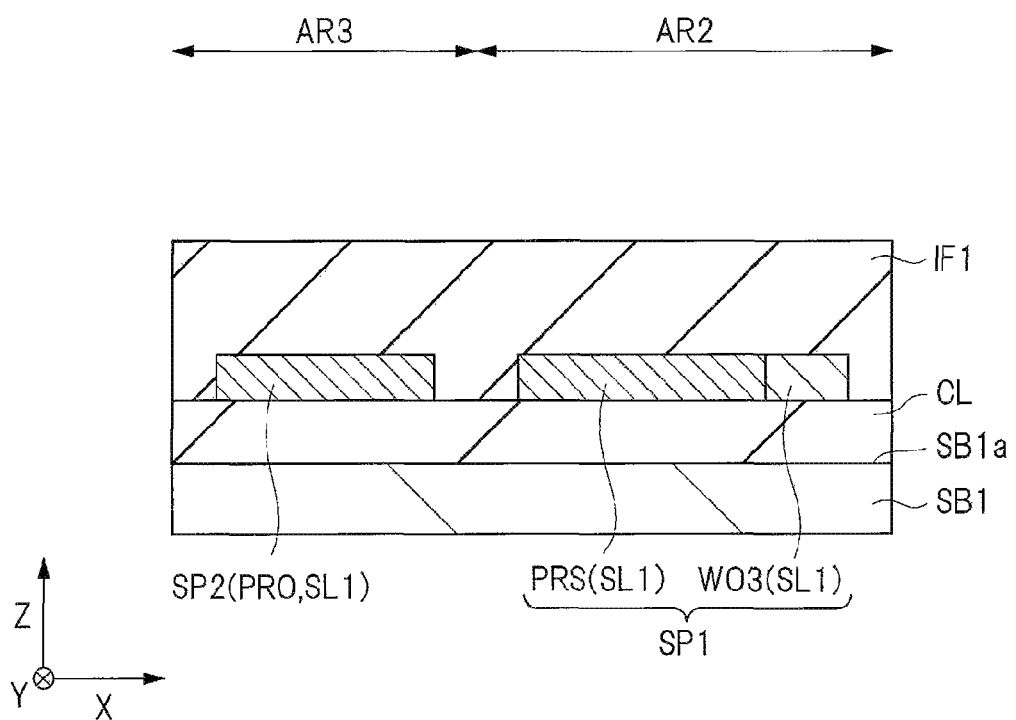
FIG. 7 is a cross-sectional view of a principal part in a manufacturing step of the semiconductor device of the first embodiment.

Next, as shown in FIG. 7, an insulation film IF1 is formed (Step 4 in FIG. 4). In this step S4, the insulation film IF1 is formed on the insulation layer CL, on the semiconductor portion SP1, and on the semiconductor portion SP2.

For example, an insulation film IF1 made of silicon oxide is formed by a PECVD method using material gas containing tetraethoxysilane (TEOS) gas and oxygen ($O_2$) gas, or material gas containing silane ($SiH_4$) gas and nitrous oxide ($N_2O$) gas. According to this PECVD method, the silicon oxide film can be formed at a high deposition rate even at a low temperature.

Figure 8:
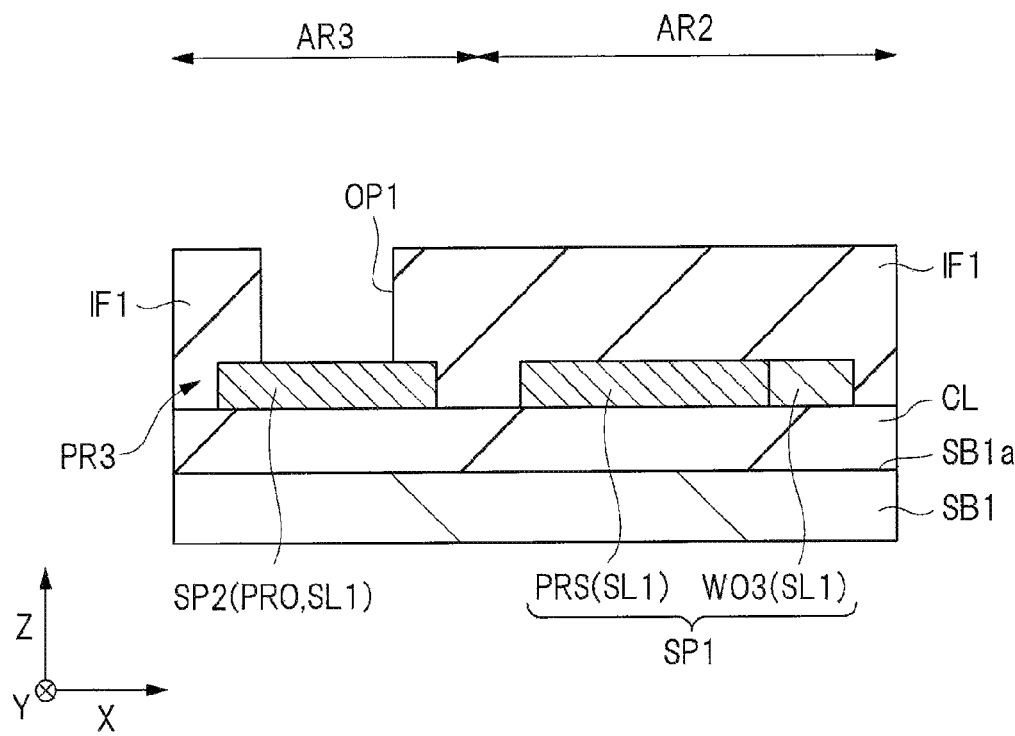
FIG. 8 is a cross-sectional view of a principal part in a manufacturing step of the semiconductor device of the first embodiment.
Figure 9:
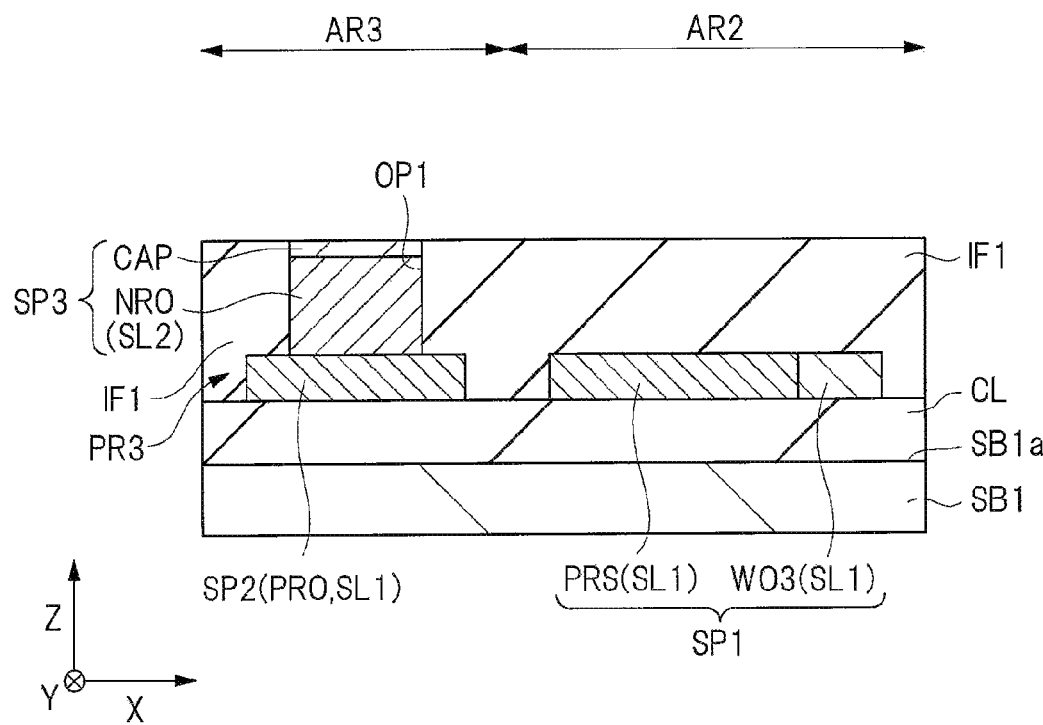
FIG. 9 is a cross-sectional view of a principal part in a manufacturing step of the semiconductor device of the first embodiment.

Next, as shown in FIGS. 8 and 9, an n-type semiconductor NRO and a cap layer CAP are formed (Step S5 in FIG. 4).

In this step S5, first, by patterning the insulation film IF1 by using a photolithography technique and an etching technique as shown in FIG. 8, an opening portion OP1 reaching an upper surface of the semiconductor portion SP2, that is, an upper surface of the p-type semiconductor PRO through the insulation film IF1 is formed in the insulation film IF1 in the region AR3.

In this step S5, next, as shown in FIG. 9, a semiconductor portion SP3 including an n-type or i/n-type semiconductor NRO which is the semiconductor layer SL2 made of germanium is formed on the portion of the p-type semiconductor PRO exposed to the bottom of the opening portion OP1 within the opening portion OP1. After a semiconductor layer SL2 made of, for example, germanium is epitaxially grown on the p-type semiconductor PRO or epitaxially grown thereon and thermally treated, n-type impurities are introduced into the semiconductor layer SL2 by an ion implantation method, so that an n-type or i/n-type semiconductor NRO can be formed. At this time, the semiconductor layer SL2 is made of n-type or i/n-type germanium.

Alternatively, when the semiconductor layer SL2 made of, for example, germanium is epitaxially grown, germanium can be partially or entirely formed in the n-type semiconductor NRO by causing an epitaxial growth using material gas containing n-type impurities. The photoelectric conversion portion PR3 for converting an optical signal to an electric signal is formed of the semiconductor portion SP2 made of the p-type semiconductor PRO and the semiconductor layer SL2 formed on the p-type semiconductor PRO, that is, formed of the n-type semiconductor NRO made of germanium.

When the semiconductor layer SL2 made of germanium is epitaxailly grown or is epitaxially grown and thermally treated at a temperature of, for example, 700° C. or lower, a defect density in the semiconductor layer SL2 increases, and, for example, decrease in a photoelectric conversion efficiency in the photoelectric conversion portion PR3 or others occurs, which results in decrease in the performance of the semiconductor device.

On the other hand, when the semiconductor layer SL2 made of germanium is epitaxailly grown or is epitaxially grown and thermally treated at a temperature higher than, for example, 700° C., a defect density in the semiconductor layer SL2 decreases, and, for example, the photoelectric conversion efficiency in the photoelectric conversion portion PR3 is improved, which can result in improvement in the performance of the semiconductor device.

In this step S5, next, as shown in FIG. 9, a cap layer CAP is formed on the n-type semiconductor NRO. As described above, the cap layer CAP prevents such a damage as surface roughness of germanium configuring the n-type or i/n-type semiconductor NRO or the decrease in the layer thickness of the n-type or in-type semiconductor NRO. For example, after a semiconductor layer made of silicon is epitaxially grown, n-type impurities are introduced into the semiconductor layer by an ion implantation method using a photoresist mask, and the photoresist mask is removed, so that a cap layer CAP that is partially doped in an n-type can be formed.

Next, as shown in FIG. 10, an insulation film IF2 is formed (Step S6 in FIG. 4). In this step S6, the insulation film IF2 is formed on the insulation film IF1. At this time, in the region AR2, the insulation film IF2 is also formed on a portion of the insulation film IF1 positioned on the semiconductor portion SP1. Therefore, in the region AR2, the insulation film IF2 is formed above the semiconductor portion SP1.

In this manner, as shown in FIG. 10, in the regions AR2 and AR3, an interlayer insulation film ID1 made of the insulation films IF1 and IF2 is formed on the insulation layer CL so as to cover the p-type semiconductor PRS, the optical waveguide WO3, the p-type semiconductor PRO, the n-type or i/n-type semiconductor NRO and the cap layer CAP.

For example, an insulation film IF2 made of silicon oxide is formed by a PECVD method using material gas containing TEOS gas and oxygen gas, or material gas containing silane gas and nitrous oxide gas. According to this PECVD method, the silicon oxide film can be formed at a high deposition rate even at a low temperature.

As shown in FIG. 14 described later, note that the interlayer insulation film ID1 made of the insulation films IF1 and IF2 is formed on the insulation layer CL in the regions AR1, AR2 and AR3 so as to cover the optical waveguides WO1, WO2 and WO3, the p-type semiconductor PRS, the n-type semiconductor NRS, the p-type semiconductor PRO, the n-type semiconductor NRO, and the cap layer CAP.

Next, as shown in FIG. 11, an opening portion OP2 is formed (Step S7 in FIG. 4). In this step S7, the interlayer insulation film ID1, that is, the insulation films IF2 and IF1 is patterned by using a photolithography technique and an etching technique. In this manner, in the region AR2, the opening portion OP2 reaching the p-type semiconductor PRS through the interlayer insulation film ID1, that is, the insulation films IF1 and IF2 is formed. That is, the opening portion OP2 reaching the semiconductor portion SP1 from the upper surface of the insulation film IF2 is formed. In the present first embodiment, the opening portion OP2 is a connection hole CT11 in which a plug PL11 (see FIG. 13 described later) is formed.

As shown in FIG. 14 described later, in this step S7, note that a connection hole CT1 reaching each of the n-type semiconductor NRS and p-type semiconductor PRO through the interlayer insulation film ID1 is formed in the region AR2 and R3.

Figure 12:
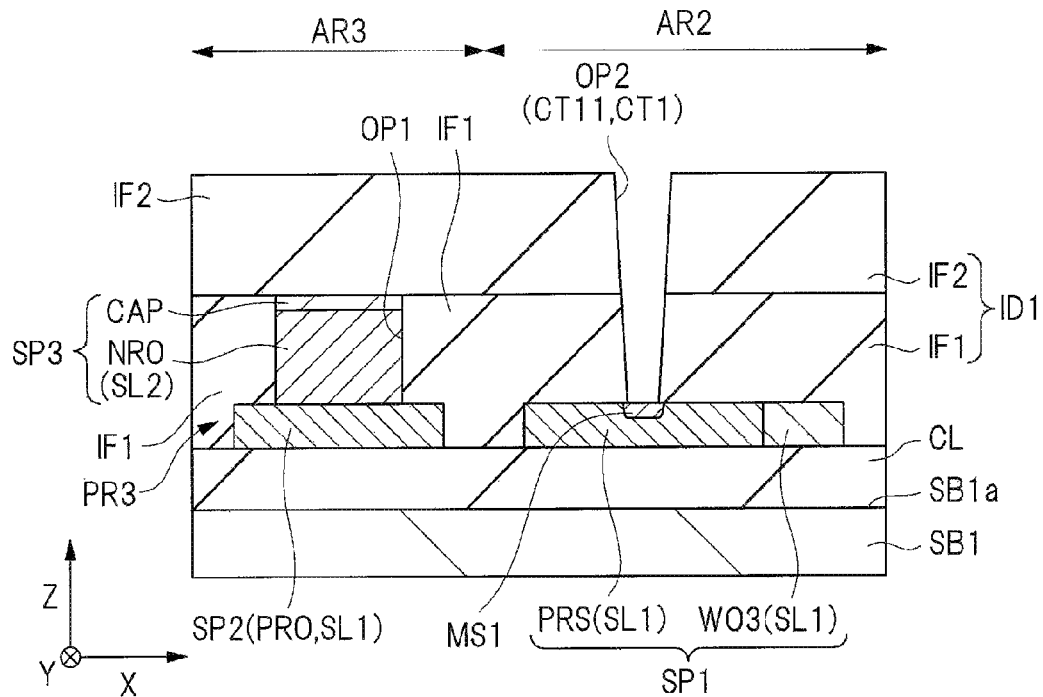
FIG. 12 is a cross-sectional view of a principal part in a manufacturing step of the semiconductor device of the first embodiment.

Next, as shown in FIG. 12, a metal silicide layer MS1 is formed (Step S8 in FIG. 4).

In this step S8, first, a metal film is formed on a portion of the semiconductor portion SP1 exposed to the bottom of the opening portion OP2, and an inner wall of the opening portion OP2, and on the insulation film IF2. The metal film is made of, for example, a cobalt (Co) film, a nickel (Ni) film, a nickel-platinum alloy film, or others, and it can be formed by a sputtering method or others. When, for example, a nickel silicide (NiSi) is formed to the semiconductor substrate SB, an upper layer portion of the semiconductor portion SP1 is caused to react with the metal film by performing a first thermal treatment at a temperature of 200 to 350° C. for 10 to 60 seconds, and then, performing a second thermal treatment at a temperature of 350 to 600° C. for 10 to 60 seconds. In this manner, a metal silicide layer MS1 is formed on an upper layer portion of a portion of the semiconductor portion SP1 exposed to the bottom of the opening portion OP2 or on the portion of the semiconductor portion SP1 exposed to the bottom of the opening portion OP2. That is, the metal silicide layer MS1 is formed on the upper surface of the portion of the semiconductor portion SP1 exposed to the bottom of the opening portion OP2.

The metal silicide layer MS1 may be, for example, a cobalt silicide layer, a nickel silicide layer, or a platinum-added nickel silicide layer. Thereafter, an unreacted metal film is removed. The metal silicide layer MS1 can be formed on the upper surface of the semiconductor portion SP1 by performing such a silicide process, as shown in FIG. 12.

Thus, the insulation film IF2 and the opening portion OP2 formed in the upper surface of the insulation layer IF2 are used as a mask pattern for forming the metal silicide layer MS1. That is, in the present first embodiment, the connection hole CT11 is the same as the opening portion OP2 used as the mask pattern for forming the metal silicide layer MS1, the metal silicide layer MS1 is formed so as to align with the inner wall of the connection hole CT11, and is formed in a region substantially identical to the region of the lower surface of the plug PL11 (see FIG. 13 described later).

In this step S8, as also shown in FIG. 14 described later, note that the metal silicide layer MS1 is also formed on an upper surface of a portion of the n-type semiconductor NRS exposed to the bottom of the connection hole CT1 in the region AR2, and the metal silicide layer MS1 is also formed on an upper surface of a portion of the p-type semiconductor PRO exposed to the bottom of the connection hole CT1 in the region AR3.

Figure 13:
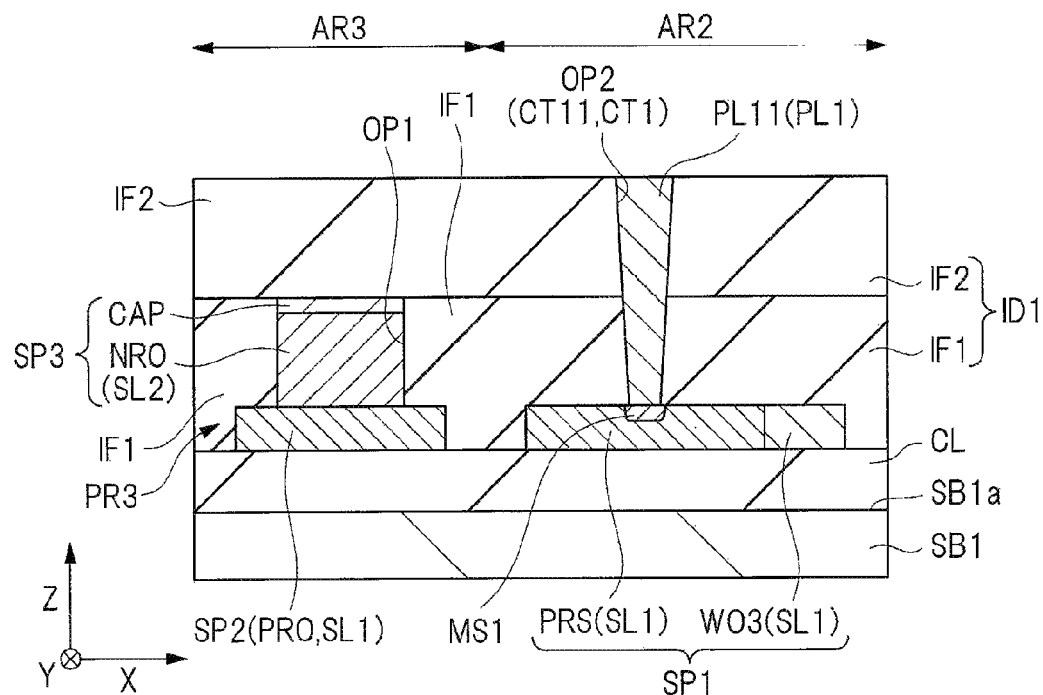
FIG. 13 is a cross-sectional view of a principal part in a manufacturing step of the semiconductor device of the first embodiment.

Next, as shown in FIG. 13, a plug PL11 is formed (Step S9 in FIG. 4). In this step S3, a conductive film made of, for example, tungsten is buried in the connection hole CT1. In this manner, the plug PL11 made of the conductive film buried in the connection hole CT11 formed above the p-type semiconductor PRS is formed.

In the step S9, as shown in FIG. 14 described later, note that a plug PL1 made of the conductive film buried in the connection hole CT1 formed above the n-type semiconductor NRS is formed in the region AR2, and a plug PL1 made of the conductive film buried in the connection hole CT1 formed above the p-type semiconductor PRO is formed in the region AR3.

Next, as shown in FIGS. 2 and 14, a plug PL12 and a wiring M1 are formed (Step S10 in FIG. 4).

In this step S10, first, as shown in FIG. 2, the insulation film IF2 is patterned by using a photolithography technique and an etching technique. In this manner, in the region AR3, a connection hole CT12 reaching the cap layer CAP included in the semiconductor portion SP3 through the insulation film IF2 is formed.

In this step S10, next, as shown in FIG. 2, a conductive film made of, for example, tungsten is buried in the connection hole CT12. In this manner, the plug PL12 made of the conductive film buried in the connection hole CT12 is formed. The plug PL12 is formed on the semiconductor portion SP3.

In this step S10, next, as shown in FIG. 14, a wiring M1 is formed. Specifically, a conductive film made of, for example, aluminum-copper alloy is formed on the interlayer insulation film ID1, and the formed conductive film is patterned, so that the wiring M1 made of the conductive film is formed. Note that the wiring M1 may be formed by a single damascene method using copper (Cu) as a main conductive material.

Next, as shown in FIG. 15, an interlayer insulation film ID2, a plug PL2, and a wiring M2 are formed (Step S11 in FIG. 4).

In this step S11, first, as shown in FIG. 15, the interlayer insulation film ID2 made of a low dielectric film such as a silicon oxide film is formed on the interlayer insulation film ID1 so as to cover the wiring M1 by a CDV method or others.

In this step S11, next, as shown in FIG. 15, the interlayer insulation film ID2 is patterned by using a photolithography technique and an etching technique. In this manner, in the region AR2 and AR3, the connection holes CT2 reaching the wiring M1 through the interlayer insulation film ID2 are formed.

In this step S11, next, as shown in FIG. 15, the conductive film made of, for example, tungsten is buried in the connection hole CT2. In this manner, the plug PL2 made of the conductive film buried in the connection hole CT2 is formed.

In this step S11, next, as shown in FIG. 15, the wiring M2 is formed. Specifically, a conductive film made of, for example, aluminum-copper alloy is formed on the interlayer insulation film ID2, and the formed conductive film is patterned. In this manner, the wiring M2 made of the conductive film is formed. Note that the wiring M2 may be formed by a single damascene method using copper as a main conductive material. Further, the wiring M2 and the plug PL2 may be collectively formed by a dual damascene method.

Thereafter, a protection film TC such as a silicon oxynitride film is formed, and an opening portion OPt reaching the wiring M2 through the protection film TC is formed in, for example, the region AR3, so that the semiconductor device shown in FIG. 1 is formed.

<Deposition Temperature of Semiconductor Layer Made of Germanium>

Figure 16:
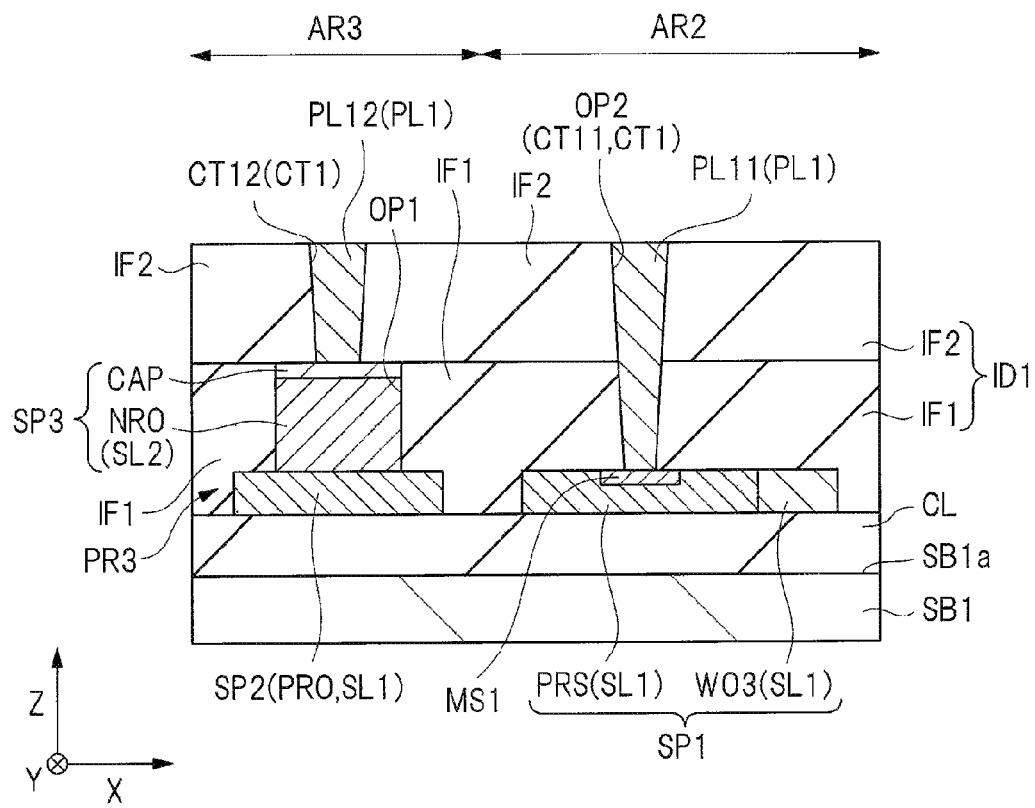
FIG. 16 is a cross-sectional view of a principal part of a semiconductor device of a comparative example.
Figure 17:
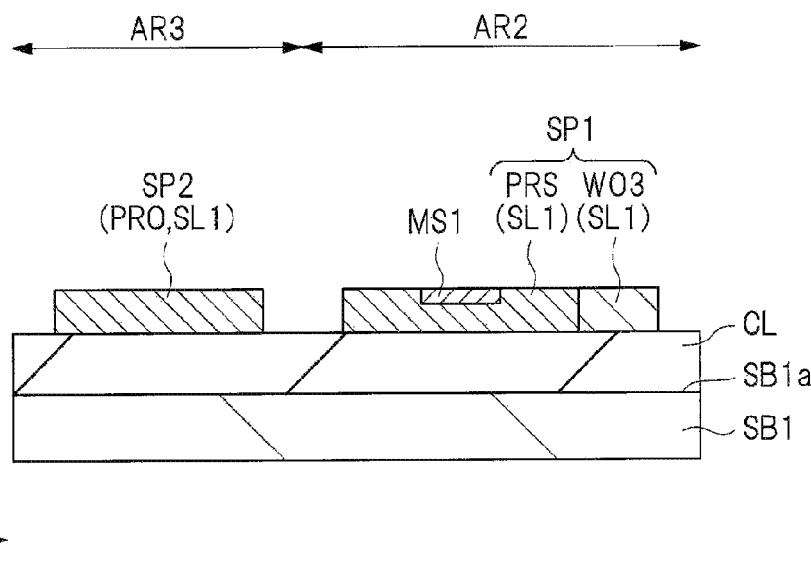
FIG. 17 is a cross-sectional view of a principal part in a manufacturing step of the semiconductor device of the comparative example.

Next, a deposition temperature of the semiconductor layer SL2 made of germanium will be explained while being compared with a method of manufacturing a semiconductor device of a comparative example. FIG. 16 is a cross-sectional view of a principal part of the semiconductor device of the comparative example. Each of FIGS. 17 and 18 is a cross-sectional view of a principal part in a manufacturing step of the semiconductor device of the comparative example. Each of FIGS. 16 to 18 shows the enlarged regions AR2 and AR3.

In a method of manufacturing the semiconductor device of the comparative example, by performing a step corresponding to the step S2 shown in FIG. 4, a semiconductor portion SP1 made of a semiconductor layer SL1 and a semiconductor portion SP2 made of the semiconductor layer SL1 are formed. Thereafter, before a semiconductor layer SL2 made of germanium is formed on the semiconductor portion SP2, a step of forming a metal silicide layer MS1 on an upper surface of the semiconductor portion SP1 is performed as shown in FIG. 17. After the metal silicide layer MS1 is formed, a semiconductor layer SL2 made of germanium is formed by performing a step corresponding to the step S3 in FIG. 4 as shown in FIG. 18.

That is, in the method of manufacturing the semiconductor device of the comparative example, the metal silicide layer MS1 is formed, and then, the semiconductor layer SL2 made of germanium is formed.

As described above, when the semiconductor layer SL2 made of germanium is epitaxially grown or is epitaxially grown and thermally treated at a temperature of, for example, 700° C. or lower, a defect density in the semiconductor layer SL2 increases, and, for example, decrease in a photoelectric conversion efficiency in the photoelectric conversion portion PR3 or others occurs, which results in decrease in the performance of the semiconductor device. Therefore, it is preferable to epitaxially grow or epitaxially grow and thermally treat the semiconductor device SL2 made of germanium at a temperature higher than, for example, 700° C.

On the other hand, the heat resistant temperature of the metal silicide layer MS1 made of, for example, nickel silicide is 600° C. or lower, which is lower than a temperature of forming the semiconductor layer SL2 made of germanium. Therefore, when the semiconductor layer SL2 made of germanium is formed after the metal silicide layer MS1 is formed, it is necessary to form the semiconductor layer SL2 at a temperature equal to or lower than the heat resistant temperature of the metal silicide layer MS1 which is the temperature of, for example, 600° C. or lower. When the metal silicide layer MS1 is thermally treated at a temperature higher than the heat resistant temperature, the resistance of the metal silicide layer MS1 increases, and therefore, for example, a contact resistance between the p-type semiconductor PRS and the plug PL11 increases.

However, when the semiconductor layer SL2 made of germanium is formed, or is formed and thermally treated at a temperature of, for example, 600° C. or lower, a defect density in the semiconductor layer SL2 increases as described above, and, for example, the photoelectric conversion efficiency in the photoelectric conversion portion PR3 decreases. Therefore, the performance of the semiconductor device cannot be improved.

Further, in the semiconductor device of the comparative example, after the metal silicide layer MS1 is formed, the connection hole CT1 reaching the metal silicide layer MS1 from an upper surface of the insulation film IF2 on the metal silicide layer MS1 is formed. Therefore, it is necessary to sufficiently consider an alignment accuracy of positions of the connection hole CT1 and the metal silicide layer MS1, and it is necessary to form the metal silicide layer MS1 in a region sufficiently wider than a region where the connection hole CT1 is formed.

<Main Features and Effects of the Present Embodiment>

Meanwhile, in the method of manufacturing the semiconductor device of the present first embodiment, the semiconductor portions SP1 and SP2 made of silicon are formed on the base body SB1 via the insulation layer CL, and the semiconductor portion SP3 including the semiconductor layer SL2 made of germanium is formed on the semiconductor portion SP2. Next, the insulation film IF2 is formed above the semiconductor portion SP1, the opening portion OP2 reaching the semiconductor portion SP1 from the upper surface of the insulation film IF2 is formed, and the metal silicide layer MS1 is formed on the portion of the upper surface of the semiconductor portion SP1 exposed to the opening portion OP2.

That is, in the method of manufacturing the semiconductor device of the present first embodiment, the semiconductor layer SL2 made of germanium is formed first, and then, the metal silicide layer MS1 is formed.

In this manner, since the semiconductor layer SL2 made of germanium can be formed in a state without the metal silicide layer MS1, the semiconductor layer SL2 can be formed at a temperature higher than the heat resistant temperature of the metal silicide layer MS1. Therefore, the defect density in the semiconductor layer SL2 made of germanium can be decreased, and, for example, the photoelectric conversion efficiency in the photoelectric conversion portion PR3 or others is improved, so that the performance of the semiconductor device can be improved.

When the semiconductor layer SL2 made of germanium is epitaxially grown or is epitaxially grown and thermally treated at a temperature of, for example, 700° C. or higher, the defect density in the semiconductor layer SL2 can be decreased. Preferably, when the semiconductor layer SL2 made of germanium is epitaxially grown or is epitaxially grown and thermally treated at a temperature of, for example, 800° C. or higher, the defect density in the semiconductor layer SL2 can be further decreased.

On the other hand, when the metal silicide layer MS1 is formed after the semiconductor layer SL2 made of germanium is formed, even if the semiconductor layer SL2 is formed at a temperature higher than the heat resistant temperature of the metal silicide layer MS1, any influence does not occur on the metal silicide layer MS1 since the metal silicide layer MS1 is not formed yet. Therefore, the increase in the resistance of the metal silicide layer MS1 can be prevented, and, for example, increase in a contact resistance between the p-type semiconductor PRS and the plug PL11 can be prevented.

Further, the semiconductor device of the present first embodiment has the semiconductor portions SP1 and SP2 formed on the base body SB1 via the insulation layer CL and made of silicon, and the semiconductor portion SP3 formed on the semiconductor portion SP2 and including the semiconductor layer SL2 made of germanium. Further, the semiconductor device has the insulation film IF2 formed above the semiconductor portion SP1, the metal silicide layer MS1 formed on the upper surface of the semiconductor portion SP1, and the opening portion OP2 reaching the metal silicide layer MS1 from the upper surface of the insulation film IF2.

In such a semiconductor device of the present first embodiment, after the connection hole CT11 serving as the opening portion OP2 is formed, the metal silicide layer MS1 is formed on the portion of the upper surface of the semiconductor portion SP1 exposed to the connection hole CT11 so as to align with the inner wall of the connection hole CT11. Therefore, it is not necessary to consider the alignment accuracy of the positions of the connection hole CT11 and the metal silicide layer MS1. That is, the semiconductor device of the present first embodiment can be manufactured by a simple manufacturing method.

Further, when seen in a plan view, for example, the end portion EP1 of the metal silicide layer MS1 on the positive side in the X direction is arranged within the connection hole CT1 serving as the opening portion OP2, or is arranged so as to project from the end portion EP2 of the connection hole CT1 on the positive side in the X-axis direction to the positive side in the X-axis direction. The projecting distance DS1 in the X-axis direction from the end portion EP2 to the end portion EP1 arranged so as to project to the positive side in the X-axis direction is equal to or less than the film thickness TH1 of the metal silicide layer MS1. In other words, the distance DS1 in the X-axis direction from the end portion EP2 to the end portion EP1 arranged on the positive side of the end portion EP2 in the X-axis direction is equal to or less than the film thickness TH1 of the metal silicide layer MS1.

The state in which the projecting distance DS1 is equal to or less than the film thickness TH1 means that the metal silicide layer MS1 is formed so as to align with the inner wall of the opening portion OP2. That is, the state in which the projecting distance DS1 is equal to or less than the film thickness TH1 means that the insulation film IF2 formed after the formation of the semiconductor layer SL2 made of germanium and the opening portion OP2 formed on the upper surface of the insulation film IF2 have been used as a mask pattern for forming the metal silicide layer MS1. Therefore, the state in which the projecting distance DS1 is equal to or less than the film thickness TH1 means that the metal silicide layer MS1 is formed after the formation of the semiconductor layer SL2 made of germanium.

Second Embodiment

In the semiconductor device of the present first embodiment, the connection hole CT11 is the same as the opening portion OP2 used as the mask pattern for forming the metal silicide layer MS1, the metal silicide layer MS1 is formed so as to align with the inner wall of the connection hole CT11, and it is formed in a region substantially equal to the region of the lower surface of the plug PL11. However, the metal silicide layer MS1 may include the region of the lower surface of the plug PL11, and may be formed in a region sufficiently wider than the region of the lower surface of the plug PL11. Such an example will be explained as a semiconductor device of a second embodiment. Note that different points from the semiconductor device of the first embodiment will be mainly explained below.

<Structures of Optical Modulation Portion and Photoelectric Conversion Portion>

Figure 20:
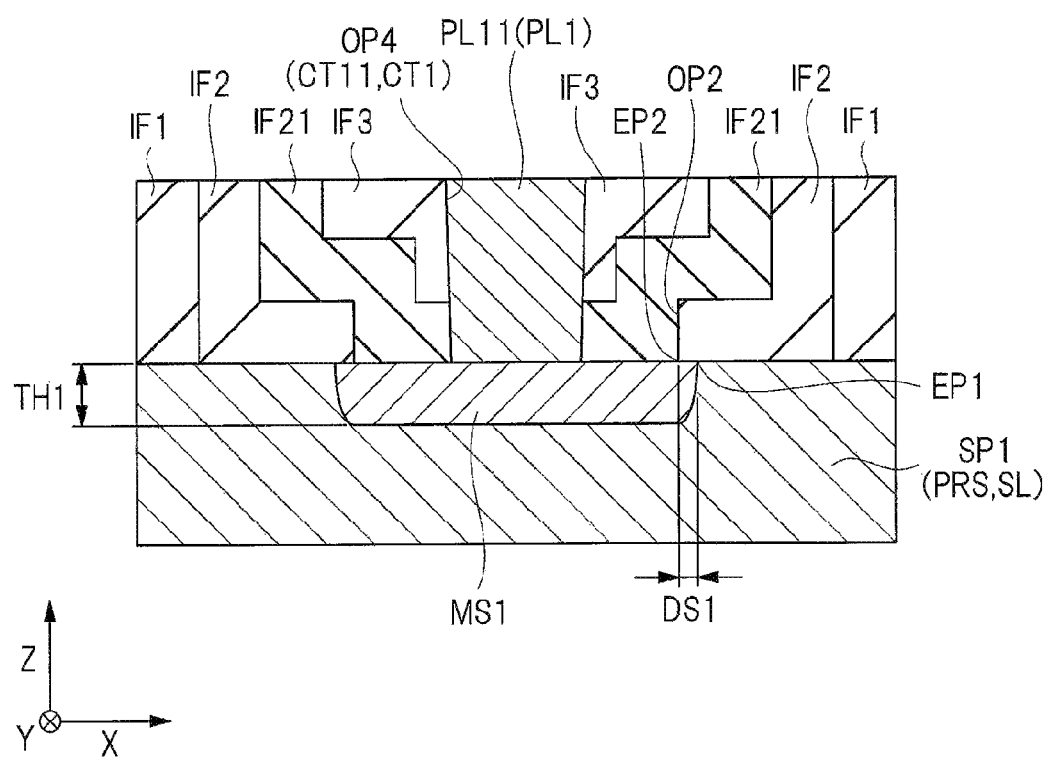
FIG. 20 is a cross-sectional view of a principal part of the semiconductor device of the second embodiment.

Each of FIGS. 19 and 20 is a cross-sectional view of a principal part of a semiconductor device of a second embodiment. FIG. 19 shows the enlarged regions AR2 and AR3. FIG. 20 shows the periphery of the metal silicide layer MS1.

As shown in FIG. 19, the semiconductor device of the present second embodiment has a semiconductor portion SP1 formed on an insulation layer CL and made of a semiconductor layer SL1, and a semiconductor portion SP2 formed on the insulation layer CL and made of a semiconductor layer SL1 as similar to the semiconductor device of the first embodiment. Further, as similar to the semiconductor device of the first embodiment, the semiconductor device of the present second embodiment has an insulation film IF1 formed on the semiconductor portion SP1 and on the semiconductor portion SP2, an opening portion OP1 reaching the semiconductor portion SP2 through the insulation film IF1, and a semiconductor portion SP3 formed on a portion of the semiconductor portion SP2 exposed to the opening portion OP1.

On the other hand, as different from the semiconductor device of the first embodiment, the semiconductor device of the present second embodiment has an opening portion OP3 reaching the semiconductor portion SP1 through the insulation film IF1. As shown in FIG. 19, note that an insulation film IF11 made of, for example, silicon oxide or silicon nitride may be formed on the insulation film IF1, and that the opening portion OP3 may reach the semiconductor portion SP1 through the insulation films IF11 and IF1. The insulation film IF11 protects the semiconductor portion SP3 when the opening portion OP3 is formed.

Further, as different from the first embodiment, in the present second embodiment, the insulation film IF2 is formed on an inner wall of the opening portion OP3 and on a portion of the semiconductor portion SP1 exposed to the opening portion OP3. Further, as different from the first embodiment, in the present second embodiment, the insulation film IF2 is preferably made of silicon nitride. An insulation film IF2 made of, for example, silicon nitride can be formed by, for example, a CVD method.

Further, as different from the first embodiment, in the present second embodiment, the opening portion OP2 reaches the metal silicide layer MS1 through a portion of the insulation film IF2 formed on the bottom of the opening portion OP3.

Further, as different from the semiconductor device of the first embodiment, the semiconductor device of the present second embodiment further has an insulation film IF3 formed on the metal silicide layer MS1 and on the insulation film IF2. As similar to the insulation film IF1, the insulation film IF3 is preferably made of silicon oxide. As described later with reference to FIG. 27, the insulation film IF3 made of silicon oxide is formed by, for example, a PECVD method.

Further, as different from the semiconductor device of the first embodiment, the semiconductor device of the present second embodiment has an opening portion OP4 reaching the metal silicide layer MS1 from an upper surface of the insulation film IF3. The opening portion OP4 is a connection hole CT11 where the plug PL11 is formed. The insulation film IF3 is buried in the opening portions OP2 and OP3, and the plug PL11 serving as a connection electrode is made of a conductive film buried in the opening portion OP4. A region of a lower surface of the opening portion OP4 is included in a region of a lower surface of the opening portion OP2 when seen in a plan view. That is, the opening portion OP4 is formed within the opening portion OP2 when seen in a plan view.

The insulation film made of, for example, silicon nitride functions as an etching stopper when the insulation film IF3 made of, for example, silicon oxide is etched. Therefore, the opening portion OP4 formed in the insulation film IF3 is formed within the opening portion OP2 formed in the insulation film IF2 when seen in a plan view.

As shown in FIG. 19, note that an insulation film IF21 may be formed on the metal silicide layer MS1 and on the insulation film IF2, and the insulation film IF3 may be formed on the metal silicide layer MS1 and on the insulation film IF2 via the insulation film IF21. Further, the insulation film IF3 is buried in the opening portions OP2 and OP3 via the insulation film IF21, and the opening portion OP4 may reach the metal silicide layer MS1 through the insulation films IF3 and IF21. The insulation film IF21 is preferably made of silicon nitride. The insulation film IF21 made of, for example, silicon nitride can be formed by, for example, a CVD method. The insulation film IF21 made of, for example, silicon nitride functions as an etching stopper when the insulation film IF3 made of, for example, silicon oxide is etched.

In the semiconductor device of the present second embodiment, the opening portion OP2 is not the connection hole CT11, but the opening portion OP4 is the connection hole CT11. A conductive film is buried in the connection hole CT11, so that a plug PL11 serving as a connection electrode made of the buried conductive film is formed. That is, the plug PL11 is formed on the metal silicide layer MS1, and is in contact with the metal silicide layer MS1.

As shown in FIG. 20, for example, an end portion EP1 of the metal silicide layer MS1 on the positive side in the X-axis direction when seen in a plan view is arranged within the opening portion OP2, or is arranged so as to project from the end portion EP2 to the positive side in the X-axis direction when seen in a plan view. A projecting distance DS1 in the X-axis direction from the end portion EP2 to the end portion EP1 arranged so as to project to the positive side in the X-axis direction is equal to or less than the film thickness TH1 of the metal silicide layer MS1.

As described later with reference to FIGS. 22 to 25, even in the method of manufacturing the semiconductor device of the present second embodiment, the semiconductor layer SL2 made of germanium is formed, and then, the opening portion OP2 is formed, and the metal silicide layer MS1 is formed on the portion of the upper surface of the semiconductor portion SP1 exposed to the bottom of the opening portion OP2 as similar to the method of manufacturing the semiconductor device of the first embodiment. Therefore, the metal silicide layer MS1 is formed so as to align with the inner surface of the opening portion OP2. Therefore, even when the metal silicide layer MS1 projects from an outer periphery of the bottom surface of the opening portion OP2 to progress, the projecting distance is equal to or less than a distance which is a progression distance of the metal silicide layer MS1 in a depth direction.

On the other hand, in the present second embodiment, the connection hole CT11 is the same as the opening portion OP4, and a region of a lower surface of the opening portion OP4 is included in a region of a lower surface of the opening portion OP2. Therefore, a whole surface of the bottom surface of the plug PL11 necessarily contacts with the metal silicide layer MS1, and therefore, the contact resistance between the plug PL11 and the semiconductor portion SP1 can be reduced further than that of the first embodiment.

<Method of Manufacturing Semiconductor Device>

Figure 21:
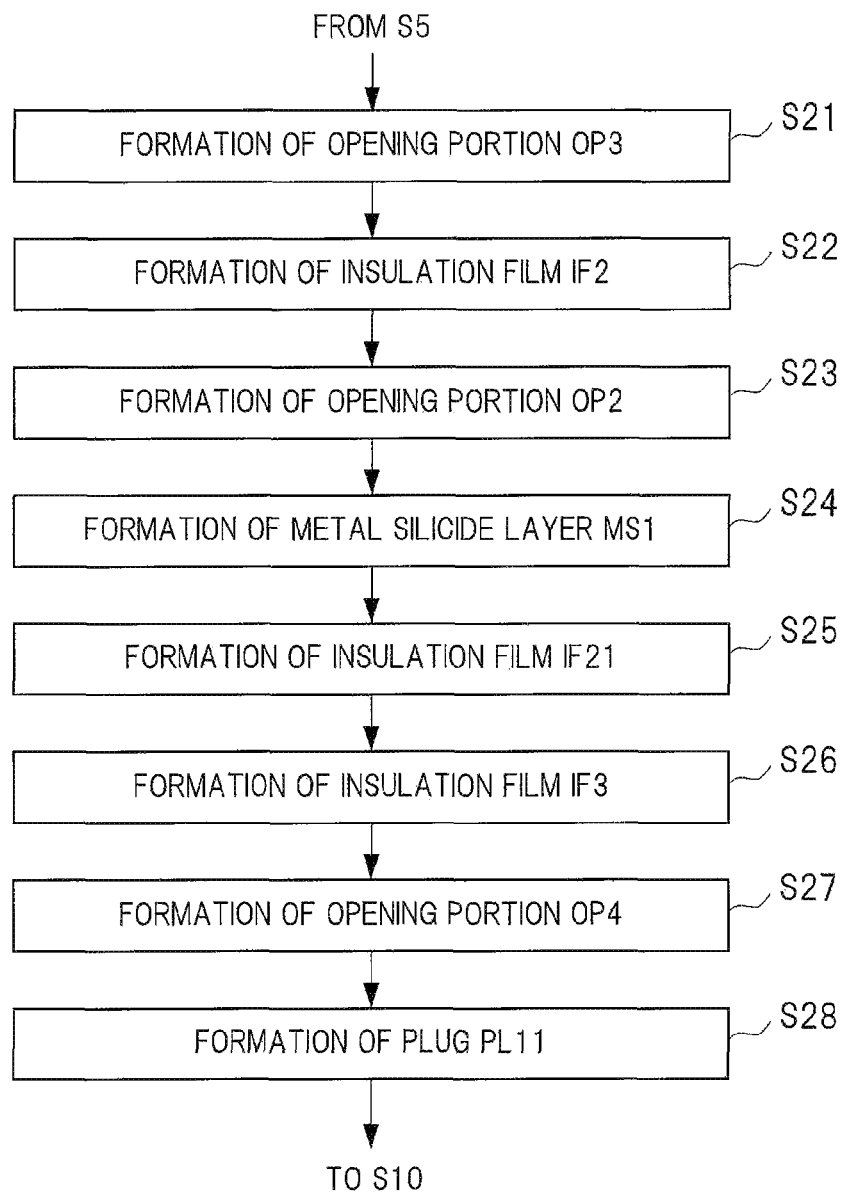
FIG. 21 is a process flowchart showing a part of a manufacturing step of the semiconductor device of the second embodiment.

Next, a method of manufacturing the semiconductor device of the present second embodiment will be described. FIG. 21 is a process flowchart showing a part of manufacturing steps of the semiconductor device of the second embodiment. Note that FIG. 21 mainly shows steps in the region AR2 serving as a region where the optical modulation portion PR2 is formed and the region AR3 serving as a region where the photoelectric conversion portion PR3 is formed are shown.

Each of FIGS. 22 to 29 is a cross-sectional view of a principal part in the manufacturing steps of the semiconductor device of the second embodiment. FIGS. 22 to 29 show the enlarged regions AR2 and AR3. Further, in the region AR2 in FIGS. 22 to 29, a part of the p-type semiconductor PRS and the optical waveguide WO3 of the optical modulation portion PR2 is shown, but illustration of the connection hole CT1 of the photoelectric conversion portion PR3 is omitted for easy understanding.

Figure 22:
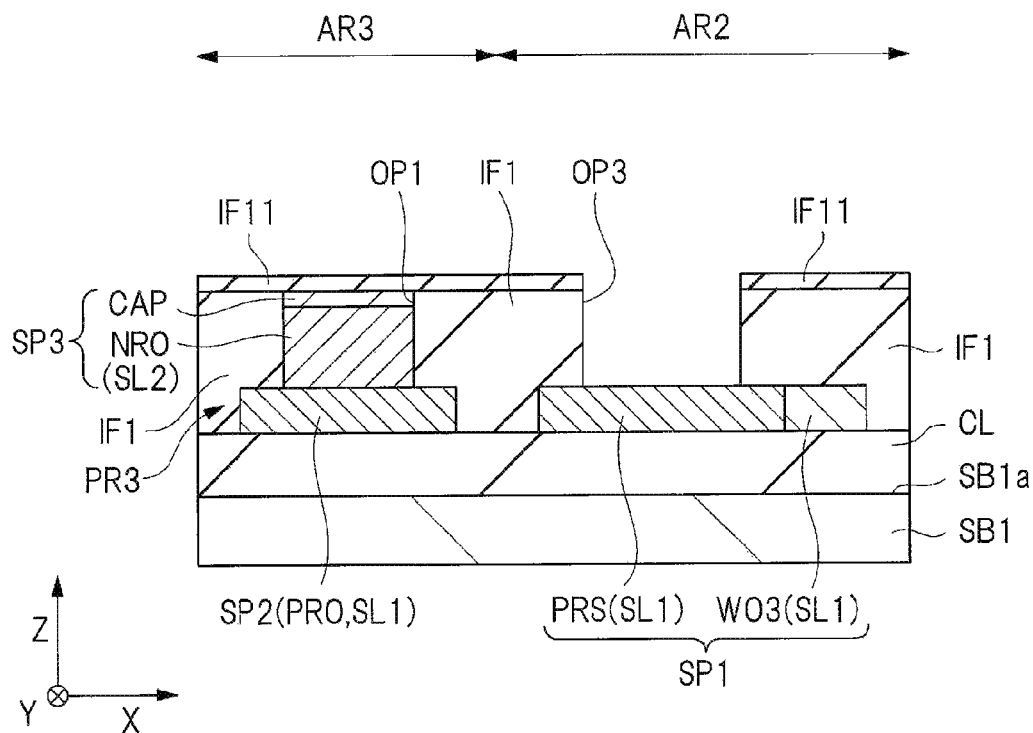
FIG. 22 is a cross-sectional view of a principal part in a manufacturing step of the semiconductor device of the second embodiment.

In the method of manufacturing the semiconductor device of the present second embodiment, a semiconductor portion SP3 including an n-type or i/n-type semiconductor NRO is formed by performing steps similar to the steps S1 to the S5 shown in FIG. 4, and then, the insulation film IF1 is patterned as shown in FIG. 22, so that the opening portion OP3 reaching the semiconductor portion SP1 through the insulation film IF1 is formed (Step S21 in FIG. 21).

When the step S21 is performed, as shown in FIG. 22, note that the opening portion OP3 reaching the semiconductor portion SP1 through the insulation films IF11 and IF1 may be formed by forming the insulation film IF11 made of, for example, silicon oxide or silicon nitride on the insulation film IF1, and patterning the insulation films IF11 and IF1. The insulation film IF11 protects the semiconductor portion SP3 when the insulation film IF1 is patterned to form the opening portion OP3.

Figure 23:
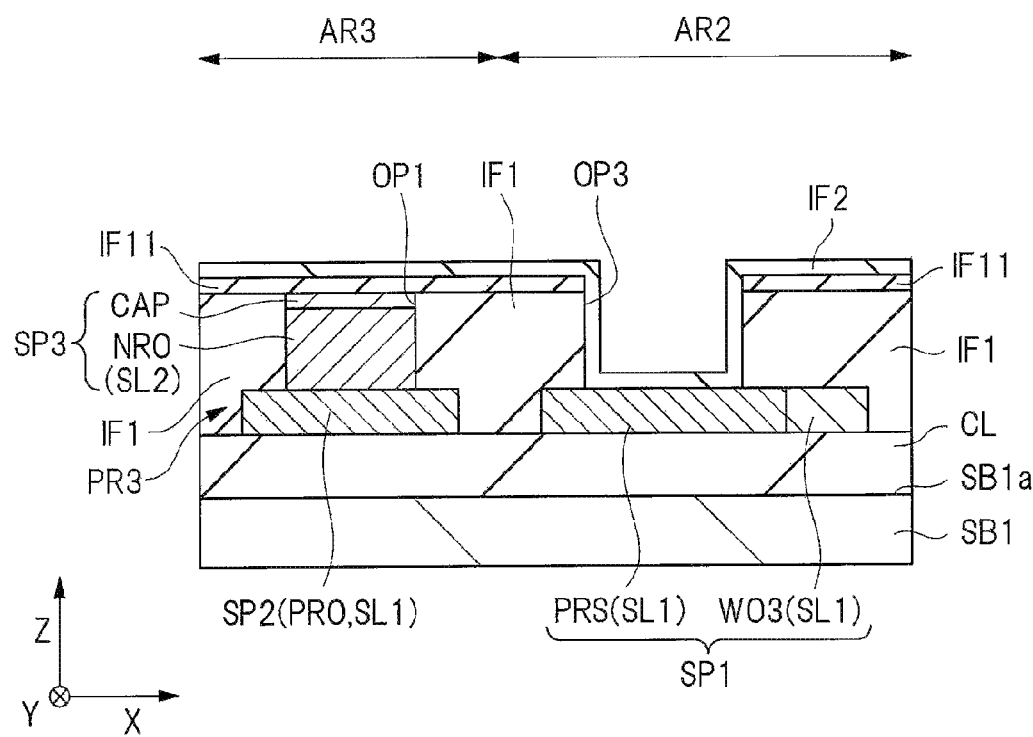
FIG. 23 is a cross-sectional view of a principal part in a manufacturing step of the semiconductor device of the second embodiment.

Next, as shown in FIG. 23, an insulation film IF2 is formed by performing a step corresponding to the step S6 shown in FIG. 4 (step S22 in FIG. 21). However, in this step S22, as different from the step S6 in FIG. 4, the insulation film IF2 is formed on the inner wall of the opening portion OP3 and on a portion of the semiconductor portion SP1 exposed to the opening portion OP3. Further, in this step S22, as different from the step S6 in FIG. 4, the insulation film IF2 is preferably made of silicon nitride. The insulation film IF2 made of, for example, silicon nitride can be formed by, for example, a CVD method.

Figure 24:
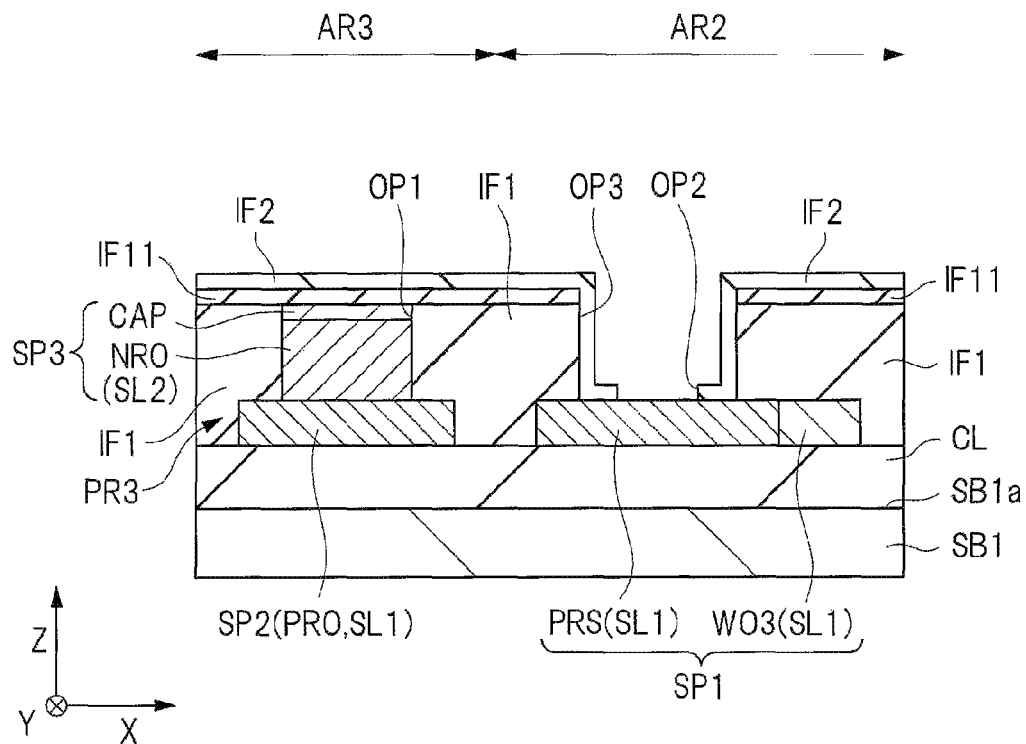
FIG. 24 is a cross-sectional view of a principal part in a manufacturing step of the semiconductor device of the second embodiment.

Next, as shown in FIG. 24, an opening portion OP2 is formed by performing a step corresponding to the step S7 in FIG. 4 (Step S23 in FIG. 21). In this step S23, the opening portion OP2 reaching the semiconductor portion SP1 through a portion of the insulation film IF2 formed on the bottom of the opening portion OP3 is formed.

Figure 25:
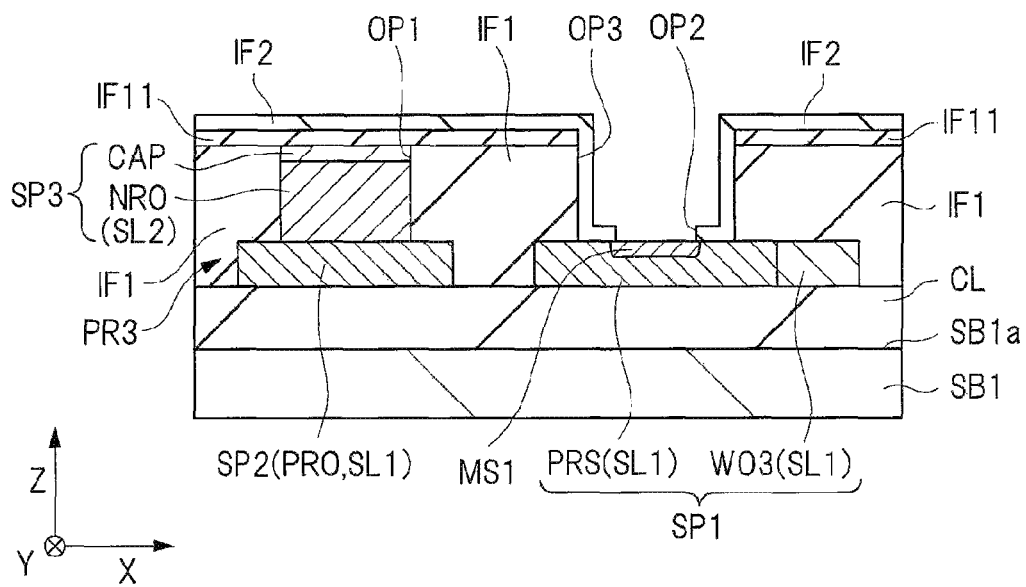
FIG. 25 is a cross-sectional view of a principal part in a manufacturing step of the semiconductor device of the second embodiment.

Next, as shown in FIG. 25, a metal silicide layer MS1 is formed by performing a step corresponding to the step S8 in FIG. 4 (Step S24 in FIG. 21). In this step S24, the metal silicide layer MS1 is formed on an upper surface of the portion of the semiconductor portion SP1 exposed to the opening portion OP2.

Figure 26:
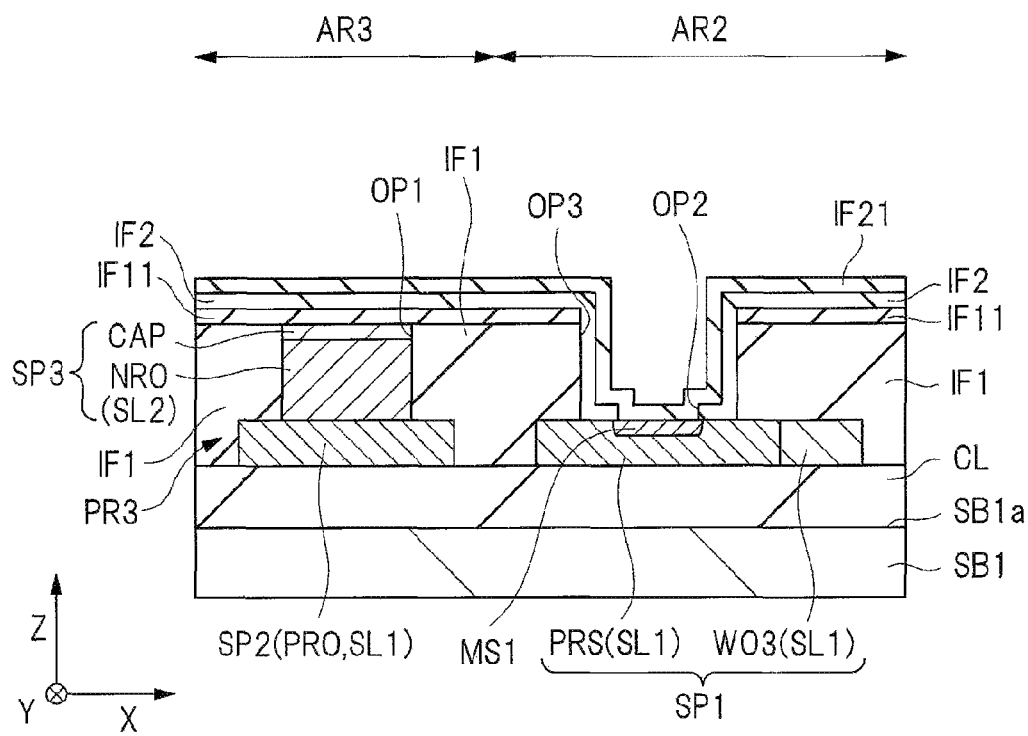
FIG. 26 is a cross-sectional view of a principal part in a manufacturing step of the semiconductor device of the second embodiment.

Next, as shown in FIG. 26, an insulation film IF21 is formed (Step S25 in FIG. 21). In this step S25, the insulation film IF21 is formed on the metal silicide layer MS1 and on the insulation film IF2. The insulation film IF21 made of, for example, silicon nitride can be formed by, for example, a CVD method.

The insulation film IF2 made of, for example, silicon nitride functions as an etching stopper when the insulation film IF3 made of, for example, silicon oxide is etched. In this manner, when an opening portion OP4 (see FIG. 28 described later) is formed, even if the film thickness of the insulation film IF3, or the evenness of the etching rate of the insulation film IF3 decreases within a main surface SB1a of the base body SB1, the etching stops once at a time at which the insulation film IF21 is exposed to the bottom of the opening portion OP4. Therefore, the portion of the semiconductor portion SP1 exposed to the opening portion OP4 can be prevented or suppressed from being etched unevenly within the main surface SB1a of the base body SB1, so that the evenness of the film thickness of the semiconductor portion SP1 within the main surface SB1a of the base body SB1 can be improved.

Figure 27:
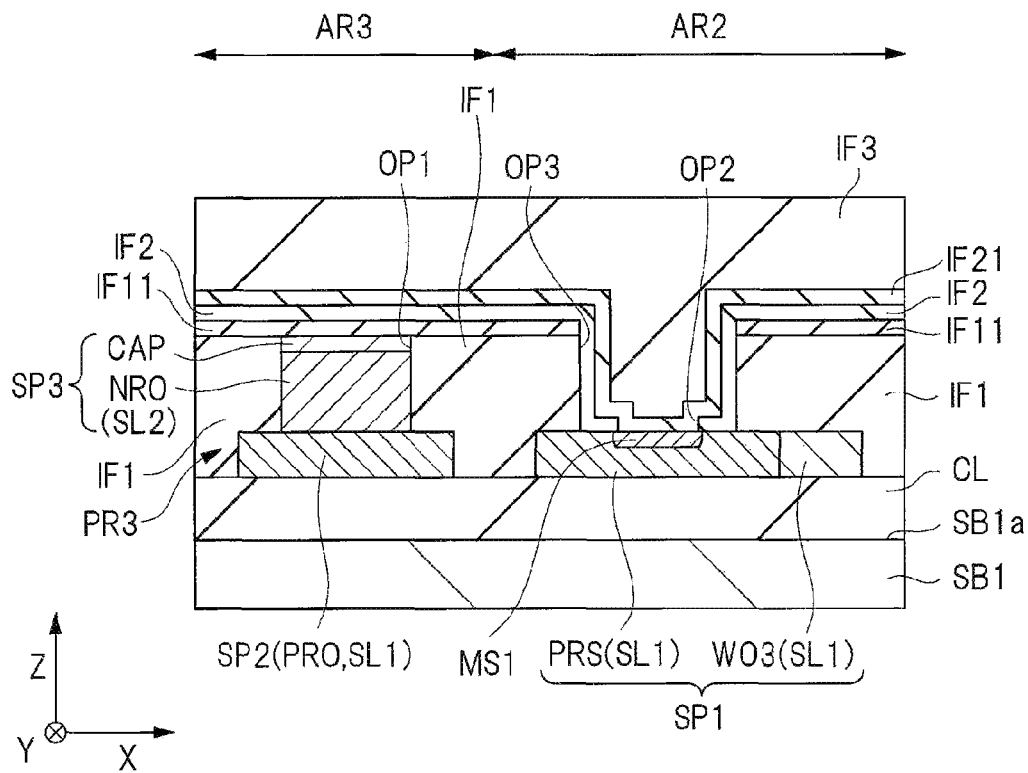
FIG. 27 is a cross-sectional view of a principal part in a manufacturing step of the semiconductor device of the second embodiment.

Next, as shown in FIG. 27, an insulation film IF3 is formed (Step S26 in FIG. 21). In this step S26, the insulation film IF3 is formed on the metal silicide layer MS1 and on the insulation film IF2 via the insulation film IF21, so that the insulation film IF3 is buried in the opening portions OP2 and OP3 via the insulation film IF21. As similar to the insulation film IF1, the insulation film IF3 is made of silicon oxide, and it can be formed by a PECVD method using, for example, material gas containing TEOS gas and oxygen gas or material gas containing silane gas and nitrous oxide gas. Further, the insulation film IF3 may be formed by a thermal CVD method using material gas containing TEOS gas and ozone (O₃) gas. This case is excellent in burying property.

Note that the insulation film IF3 can be formed directly on the metal silicide layer MS1 and on the insulation film IF2 in the step S26 without performing the step S25, that is, without forming the insulation film IF21, so that the insulation film IF3 can be buried in the opening portions OP2 and OP3. In such a case, the insulation film IF2 made of, for example, silicon nitride functions as an etching stopper when an insulation film IF3 made of, for example, silicon oxide (see FIG. 28 described later) is etched. Therefore, an opening portion OP4 (see FIG. 28 described later) formed in the insulation film IF3 is formed within the opening portion OP2 formed in the insulation film IF2 when seen in a plan view.

Figure 28:
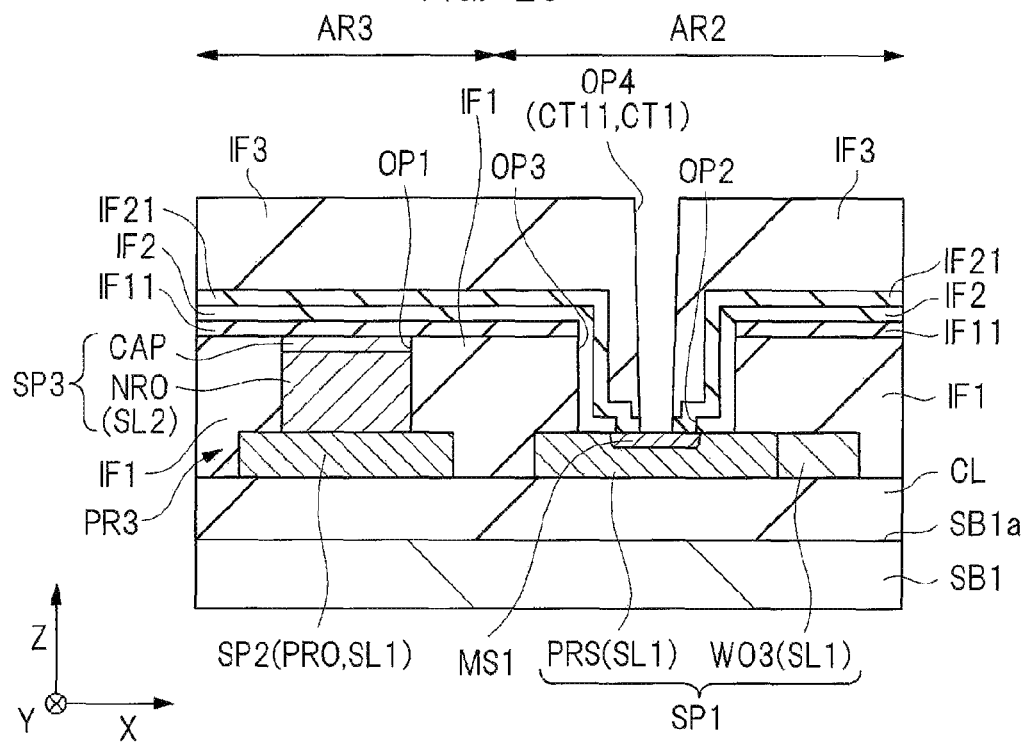
FIG. 28 is a cross-sectional view of a principal part in a manufacturing step of the semiconductor device of the second embodiment.

Next, as shown in FIG. 28, the opening portion OP4 is formed (Step S27 in FIG. 21). In this step S27, the opening portion OP4 reaching the metal silicide layer MS1 from an upper surface of the insulation film IF3 by patterning the insulation films IF3 and IF21 using a photolithography technique and an etching technique. That is, the opening portion OP4 reaching the metal silicide layer MS1 through the insulation films IF3 and IF21 is formed.

The opening portion OP4 is the connection CT11 where a plug PL11 is formed. Further, a region of a lower surface of the opening portion OP4 is included in a region of a lower surface of the opening portion OP2.

Figure 29:
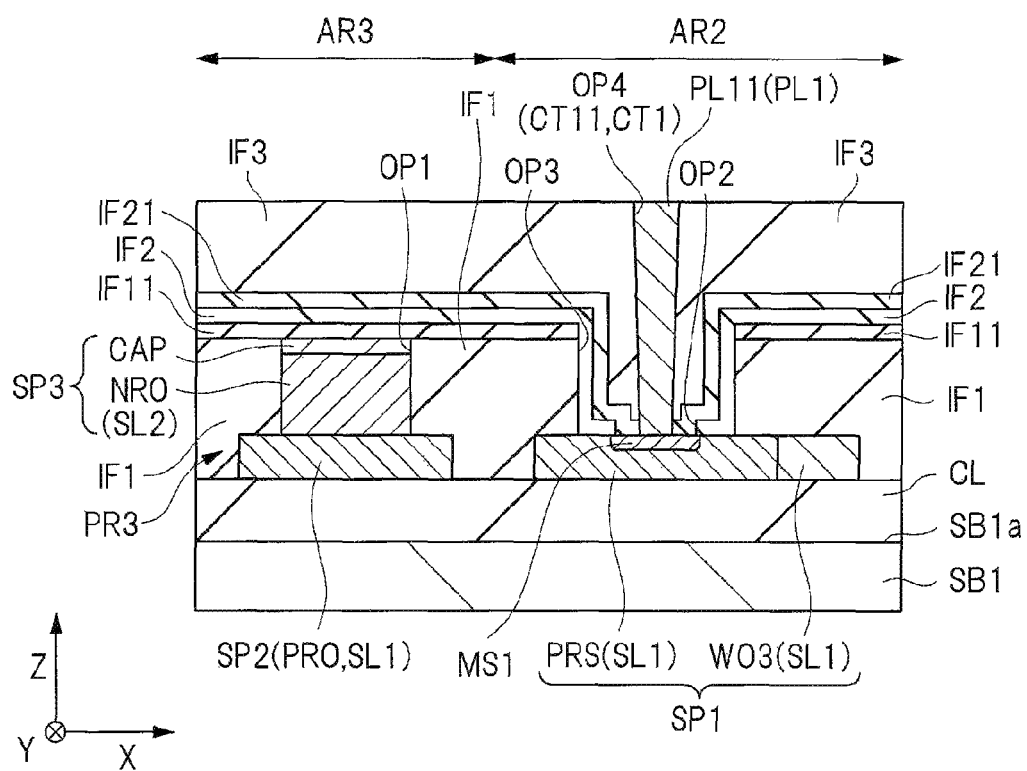
FIG. 29 is a cross-sectional view of a principal part in a manufacturing step of the semiconductor device of the second embodiment.

Next, as shown in FIG. 29, the plug PL11 is formed by performing a step corresponding to the step S9 in FIG. 4 (Step S28 in FIG. 21). In this step S28, a conductive film is buried in the opening portion OP4 to form the plug PL11 serving as the connection electrode made of the buried conductive film.

As describe above, the region of the lower surface of the opening portion OP4 is included in the region of the lower surface of the opening portion OP2 when seen in a plan view. Therefore, the whole bottom surface of the plug PL11 necessarily contacts with the metal silicide layer MS1, and therefore, the contact resistance between the plug PL11 and the semiconductor portion SP1 can be reduced further than that of the first embodiment.

Next, the semiconductor device of the present second embodiment is manufactured by performing steps corresponding to the step S10 and the step S11 in FIG. 4, and performing the steps subsequent thereto. In the step corresponding to the step S10 in FIG. 4, note that a connection hole CT12 serving as an opening portion reaching the semiconductor portion SP3 through the insulation films IF3, IF21, IF2 and IF11 is formed in the region AR3. Further, in the step corresponding to the step S11 in FIG. 4, a plug PL12 serving as a connection electrode is formed on the portion of semiconductor portion SP3 exposed to the connection hole CT12.

<Main Features and Effects of the Present Embodiment>

The method of manufacturing the semiconductor device of the present second embodiment has features similar to the features which the method of manufacturing the semiconductor device of the first embodiment has, and has effects similar to the effects which the method of manufacturing the semiconductor device of the first embodiment has. Further, the semiconductor device of the present second embodiment has features similar to the features which the semiconductor device of the first embodiment has, and has effects similar to the effects which the semiconductor device of the first embodiment has.

Meanwhile, in the present second embodiment, the metal silicide layer MS1 includes the region of the lower surface of the plug PL11, and is formed in a region sufficiently wider than the region of the lower surface of the plug PL11. Therefore, the whole bottom surface of the plug PL11 necessarily contacts with the metal silicide layer MS1, and therefore, the contact resistance between the plug PL11 and the semiconductor portion SP1 can be reduced further than that of the first embodiment.

Third Embodiment

In the semiconductor device of the second embodiment, a part of the insulation films IF2 and IF21 may be removed, the part being positioned outside the opening portion OP3 when seen in a plan view and being formed above the semiconductor portion SP1. Such an example will be explained as a semiconductor device of a third embodiment.

Note that different points from the semiconductor device of the second embodiment will be mainly explained below.

<Structures of Optical Modulation Portion and Photoelectric Conversion Portion>

Figure 30:
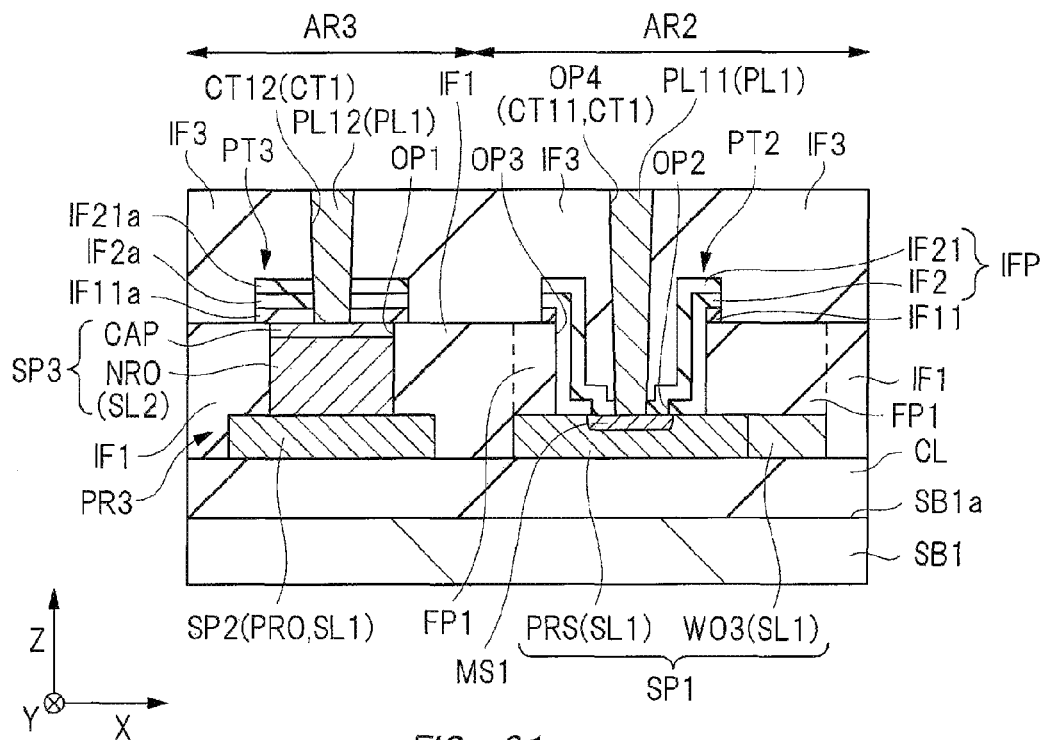
FIG. 30 is a cross-sectional view of a principal part of a semiconductor device of a third embodiment.

FIG. 30 is a cross-sectional view of a principal part of the semiconductor device of the third embodiment. FIG. 30 shows the enlarged regions AR2 and AR3.

As shown in FIG. 30, as different from the semiconductor device of the second embodiment, in the semiconductor device of the present third embodiment, a film portion PT1 (see FIG. 31 described later) which is a part of an insulation film portion IFP made of the insulation films IF2 and IF21 is removed, the part being positioned outside the opening portion OP3 when seen in a plan view and being formed above the semiconductor portion SP1. Therefore, in the present third embodiment, the film portion FP1 which is a part of the insulation film IF1 is in contact with the insulation film IF3, the part being positioned outside the opening portion OP3 when seen in a plan view and being formed on the semiconductor portion SP1. Note that a part of the insulation film IF11 is also removed, the part being positioned outside the opening portion OP3 when seen in a plan view and being formed above the semiconductor portion SP1.

In this manner, as different from the second embodiment, in the present third embodiment, the semiconductor portion SP1 is partially covered with not the insulation films IF2 and IF21 made of, for example, silicon nitride, but only the insulation film IF1 and IF3 made of, for example, silicon oxide.

As described above, the refraction index of silicon to light having a wavelength of, for example, 1.55 μm is, for example, 3.5, the refraction index of silicon oxide thereto is, for example, 1.46, and the refraction index of silicon is higher than the refraction index of silicon oxide. Meanwhile, the refraction index of silicon nitride to light having a wavelength of, for example, 1.55 μm is 2.0, and the refraction index of silicon nitride is lower than the refraction index of silicon but higher than the refraction index of silicon oxide. Therefore, for the core layer made of silicon, the cladding layer made of silicon oxide has a higher function as the cladding layer than the cladding layer made of silicon nitride.

Therefore, a portion of the optical waveguide WO3 serving as the core layer formed of the semiconductor portion SP1, the portion being not covered with the insulation films IF2 and IF21, is covered with only the cladding layer made of silicon oxide, and therefore, the optical characteristics of the optical waveguide WO3 can be improved.

Note that the semiconductor device of the present third embodiment has an insulation film IF11a formed on the semiconductor portion SP3, the insulation film IF11a being formed in the same layer as the insulation film IF11. Further, the semiconductor device of the present third embodiment has an insulation film IF2a on the semiconductor portion SP3 and an insulation film IF21a on the insulation film IF2a, the insulation film IF2a being formed in the same layer as the insulation film IF2 through the insulation film IF11a and being made of silicon nitride, the insulation film IF21a being formed in the same layer as the insulation film IF21 and being made of silicon nitride. The insulation film IF3 is formed on the insulation film IF21a. The semiconductor device of the present third embodiment further has a connection hole CT12 and a plug PL12, the connection hole CT12 serving as an opening portion reaching the semiconductor portion SP3 through the insulation films IF3, IF21a, IF2a and IF11a, the plug PL12 serving as a connection electrode formed on a portion of the semiconductor SP3 exposed to the connection hole CT12.

<Method of Manufacturing Semiconductor Device>

Figure 31:
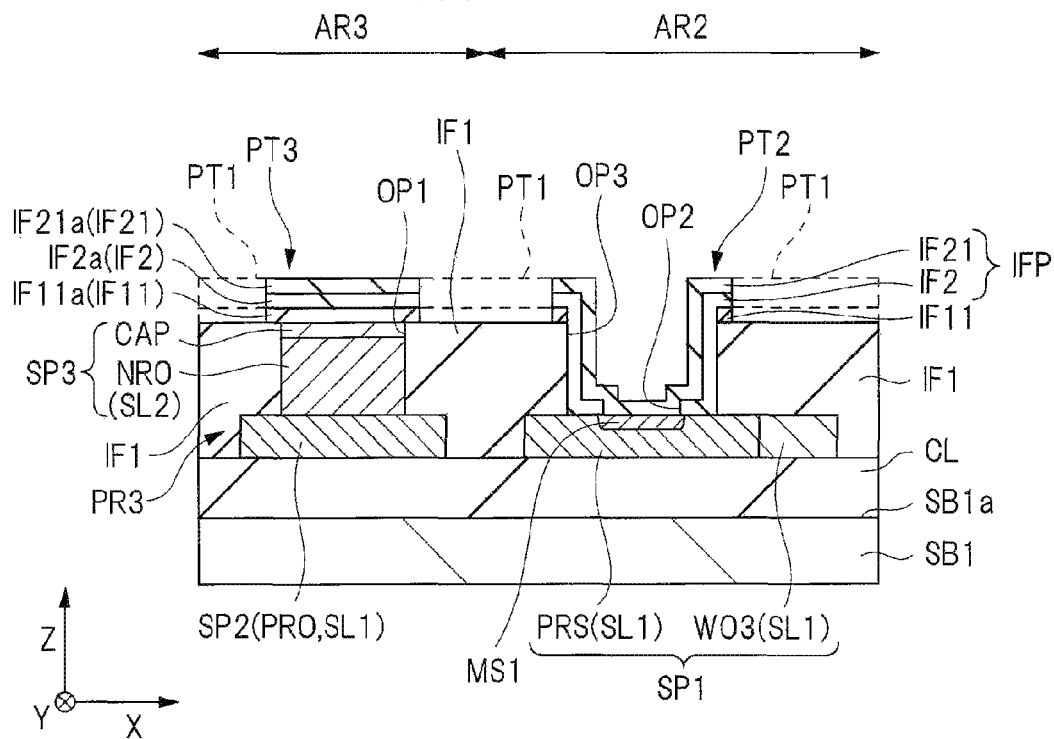
FIG. 31 is a cross-sectional view of a principal part in a manufacturing step of the semiconductor device of the third embodiment.
Figure 32:
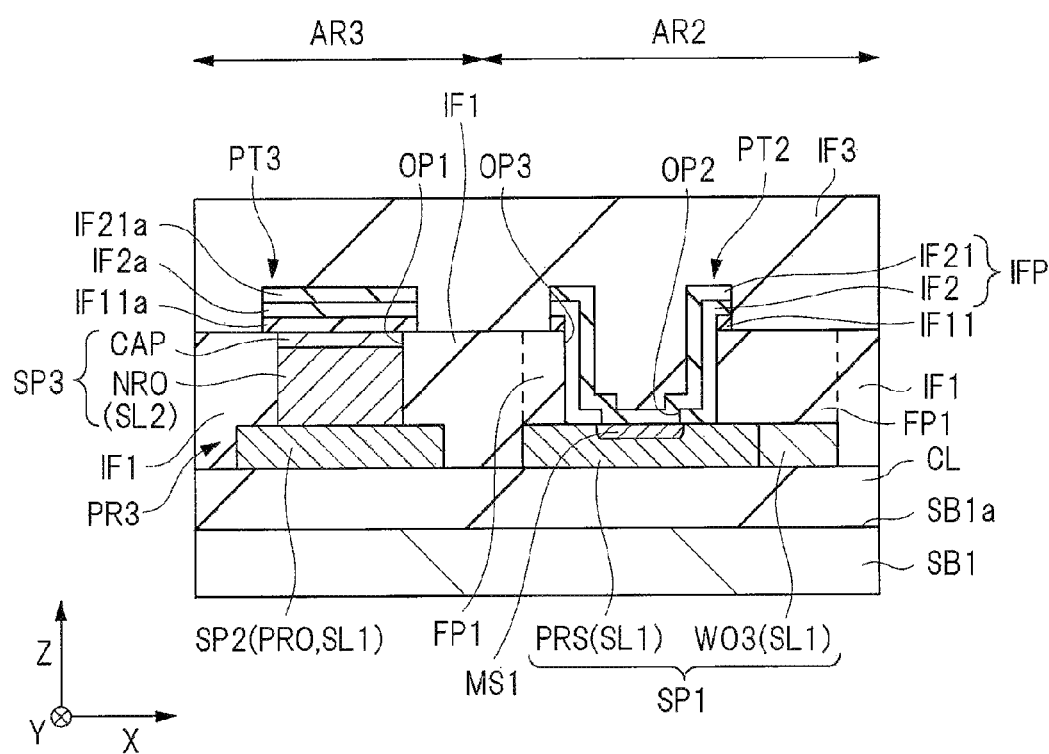
FIG. 32 is a cross-sectional view of a principal part in a manufacturing step of the semiconductor device of the third embodiment.

Next, a method of manufacturing a semiconductor device of the present third embodiment will be explained. Each of FIGS. 31 and 32 is a cross-sectional view of a principal part in manufacturing steps of the semiconductor device of the third embodiment. FIGS. 31 and 32 show the enlarged regions AR2 and AR3. Further, in the region AR2 in FIGS. 31 and 32, a part of the p-type semiconductor PRS and the optical waveguide WO3 of the optical modulation portion PR2 is shown, but illustration of the connection hole CT1 of the photoelectric conversion portion PR3 is omitted for easy understanding.

In the method of manufacturing the semiconductor device of the present third embodiment, a semiconductor portion SP3 including an n-type semiconductor NRO is formed by performing steps similar to the steps S1 to the S5 shown in FIG. 4, and then, the insulation film IF21 is formed by performing steps similar to the steps S21 to the S25 shown in FIG. 21. Further, in a step similar to the step S25 in FIG. 21, an insulation film portion IFP made of the insulation film IF2 and IF21 is formed.

Meanwhile, in the present third embodiment, a step similar to the step S25 in FIG. 21 is performed, and then, the insulation film portion IFP is patterned as shown in FIG. 31. In this manner, in the region AR2, a film portion PT1 which is a part of the insulation film portion IFP is removed, the part being positioned outside the opening portion OP3 when seen in a plan view and being formed above the semiconductor portion SP1, a film portion PT2 which is a part of the insulation film portion IFP is left, the part being positioned inside the opening portion OP3 when seen in a plan view and being formed above the semiconductor portion SP1. Further, in the region AR3, a film portion PT3 of the insulation film portion IFP may be left, the film portion PT3 being formed on the semiconductor portion SP3. The insulation film IF2 included in the film portion PT3 is referred to as insulation film IF2a, and the insulation film IF21 included in the film portion PT3 is referred to as insulation film IF21a. In FIG. 31, note that a part of the insulation portion IFP to be removed, the part being except for the film portions PT2 and PT3, is shown as the film portion PT1 by a broken line. At this time, a part of the insulation film IF11, the part being positioned below the film portion PT1, is also removed. The insulation portion IF11 which is the part positioned below the film portion PT3 is referred to as insulation film IF11a.

Next, as shown in FIG. 32, an insulation film IF3 is formed by performing a step corresponding to the step S26 in FIG. 21. In the step corresponding to the step S26, the insulation film IF3 is formed on the insulation film IF1, on the metal silicide layer MS1, the film portion PT2, and the film portion PT3. At this time, the film portion FP1 which is a part the insulation film IF1 contacts with the insulation film IF3, the part being positioned outside the opening portion OP3 when seen in a plan view and being formed on the semiconductor portion SP1.

Next, as shown in FIG. 30, an opening portion OP4 is formed by performing a step corresponding to the step S27 in FIG. 21. In the step corresponding to the step S27, the opening portion OP4 reaching the metal silicide layer MS1 through the insulation film IF3 and the film portion PT2 is formed.

Next, as shown in FIG. 30, a plug PL11 is formed by performing a step corresponding to the step S28 in FIG. 21.

Next, the semiconductor device of the present third embodiment is manufactured by performing steps corresponding to the step S10 and the step S11 in FIG. 4 and performing steps subsequent thereto. In the region AR3 in the step corresponding to the step S10 in FIG. 4, note that a connection hole CT12 serving as an opening portion reaching the semiconductor portion SP3 through the insulation film IF3, the film portion PT3 and the insulation film IF11a is formed. Further, in the step corresponding to the step S11 in FIG. 4, a plug PL12 serving as a connection electrode is formed on a portion of the semiconductor portion SP3 exposed to the connection hole CT12.

<Main Features and Effects of the Present Embodiment>

The method of manufacturing the semiconductor device of the third embodiment has features similar to the features which the method of manufacturing the semiconductor device of the second embodiment has, and has effects similar to the effects which the method of manufacturing the semiconductor device of the second embodiment has. Further, the semiconductor device of the present third embodiment has features similar to the features which the semiconductor device of the second embodiment has, and has effects similar to the effects which the semiconductor device of the second embodiment has.

On the other hand, in the present third embodiment, the film portion PT1 which is a part of the insulation film portion IFP made of the insulation films IF2 and IF21 is removed, the part being positioned outside the opening portion OP3 when seen in a plan view and being formed above the semiconductor portion SP1. Therefore, since a part of the optical waveguide WO3 serving as the core layer formed of the semiconductor portion SP1, the part being not covered with the insulation films IF2 and IF21, is covered with only the cladding layer made of silicon oxide, the optical characteristics of the optical waveguide WO3 can be improved.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A method of manufacturing a semiconductor device, the method comprising:
    (a) preparing a semiconductor substrate including a base body, an insulation layer formed on the base body, and a first semiconductor layer formed on the insulation layer and comprising silicon;
    (b) patterning the first semiconductor layer, and forming a first semiconductor portion comprising the first semiconductor layer and a second semiconductor portion comprising the first semiconductor layer,
    (c) forming a first insulation film on the first semiconductor portion and on the second semiconductor portion;
    (d) forming a first opening portion to reach the second semiconductor portion through the first insulation film;
    (e) forming a third semiconductor portion including a second semiconductor layer comprising germanium on a part of the second semiconductor portion, the part being exposed to the first opening portion;
    (f) after the (e), forming a second insulation film above the first semiconductor portion;
    (g) forming a second opening portion reaching the first semiconductor portion from an upper surface of the second insulation film;
    (h) forming a metal silicide layer on a pert of an upper surface of the first semiconductor portion, the part being exposed to the second opening portion; and (i) forming a first connection electrode on the metal silicide layer, wherein an optical waveguide including the first semiconductor portion is provided, wherein the second semiconductor portion comprises silicon of a first conductivity type, wherein the second semiconductor layer comprises germanium of a second conductivity type different from the first conductivity type, and wherein a photoelectric conversion portion, for converting an optical signal to an electric signal, including the second semiconductor portion and the second semiconductor layer is provided.

2. The method of manufacturing the semiconductor device according to claim 1, wherein the first insulation film extends from a side surface of the first semiconductor layer located in the first semiconductor portion to another side surface of the first semiconductor layer located in the second semiconductor portion.

3. The method of manufacturing the semiconductor device according to claim 1, wherein, in the (f), the second insulation film is formed on the first insulation film, wherein in the (g), the second opening portion reaching the first semiconductor portion through the second insulation film and the first insulation film is formed, and wherein, in the (i), the first connection electrode comprising a first conductive film buried in the second opening portion is formed.

4. The method of manufacturing the semiconductor device according to claim 2, further comprising:

(j) after the (e) and before the (f), forming a third opening portion reaching the first semiconductor portion through the first insulation film, wherein, in the (f), the second insulation film is formed on an inner wall of the third opening portion and on a part of the first semiconductor portion, the part being exposed to the third opening portion, and wherein, in the (g), the second opening portion reaches the first semiconductor portion through a part of the second insulation film, the part of the second insulation film being formed on a bottom of the third opening portion is formed, the method of manufacturing the semiconductor device further comprising:

(k) after the (h), forming a third insulation film on the metal silicide layer and on the second insulation film, and burying the third insulation film in the second opening portion and the third opening portion; and (l) before the (i), forming a fourth opening portion reaching the metal silicide layer from an upper surface of the third insulation film, wherein, in the (i), the first connection electrode comprising a second conductive film buried in the fourth opening portion is formed.

5. The method of manufacturing the semiconductor device according to claim 4, further comprising:

(m) after the (h) and before the (k), forming a fourth insulation film comprising silicon nitride on the metal silicide layer and on the second insulation film, wherein, in the (f), the second insulation film comprising silicon nitride is formed, wherein, in the (k), the third insulation film comprising silicon oxide is formed on the metal silicide layer and on the second insulation film via the fourth insulation film, and wherein, in the (l), the fourth opening portion reaching the metal silicide layer through the third insulation film and the fourth insulation film is formed.

6. The method of manufacturing the semiconductor device according to claim 5, wherein, in the (c), the first insulation film comprising silicon oxide is formed, and wherein, in the (m), an insulation film portion comprising the second insulation film and the fourth insulation film is formed, the method of manufacturing the semiconductor device further comprising:

(n) after the (m) and before the (k), patterning the insulation film portion, and removing a first film portion which is a part of the insulation film portion, the part of the insulation film portion being positioned outside the third opening portion when seen in a plan view and being formed above the first semiconductor portion, so that a second film portion which is a part of the insulation film portion is left, the part being positioned inside the third opening portion when seen in the plan view and being formed above the first semiconductor portion, wherein, in the (k), the third insulation film is formed on the first insulation film, on the metal silicide layer, and on the second film portion, and wherein, in the (l), the fourth opening portion reaching the metal silicide layer through the third insulation film and the second film portion is formed.

7. The method of manufacturing the semiconductor device according to claim 6, wherein, in the (n), a third film portion which is a part of the insulation film portion is left, the part of the insulation film portion is left being formed on the third semiconductor portion, and wherein, in the (k), the third insulation film is formed on the third film portion, and the method of manufacturing the semiconductor device further comprising:

(o) forming a fifth opening portion reaching the third semiconductor portion through the third insulation film and the third film portion; and (p) forming a second connection electrode on a part of the third semiconductor portion, the part being exposed to the fifth opening portion.

8. The method of manufacturing the semiconductor device according to claim 2, wherein the side surface of the first semiconductor layer apposes said another side surface of the first semiconductor layer, the first insulation film continuously extending from the side surface of the first semiconductor layer to said another side surface of the first semiconductor layer.

9. The method of manufacturing the semiconductor device according to claim 2, wherein the first insulation film is disposed on an upper surface of the first semiconductor layer located in the first semiconductor portion and in the second semiconductor portion, the side surface of the first semiconductor layer and said another side surface of the first semiconductor layer being located below the upper surface of the first semiconductor layer.

\* \* \* \* \*